(12) United States Patent
Nakamura

(10) Patent No.: US 6,856,544 B2
(45) Date of Patent: Feb. 15, 2005

(54) SEMICONDUCTOR MEMORY DEVICE IN WHICH SOURCE LINE POTENTIAL IS CONTROLLED IN ACCORDANCE WITH DATA PROGRAMMING MODE

(75) Inventor: Hiroshi Nakamura, Fujisawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 10/376,847

(22) Filed: Feb. 28, 2003

(65) Prior Publication Data

US 2003/0128587 A1 Jul. 10, 2003

Related U.S. Application Data

(63) Continuation of application No. 09/876,744, filed on Jun. 7, 2001, now Pat. No. 6,567,305.

(30) Foreign Application Priority Data

Jun. 9, 2000 (JP) .......................................... 200-173716

(51) Int. Cl.$^7$ .............................................. G11C 16/04
(52) U.S. Cl. .............................. 365/185.11; 365/185.26
(58) Field of Search ....................... 365/185.11, 185.26, 365/185.14, 226

(56) References Cited

U.S. PATENT DOCUMENTS

| | | | |
|---|---|---|---|
| 5,615,165 A | | 3/1997 | Tanaka et al. |
| 5,774,397 A | * | 6/1998 | Endoh et al. ........... 365/185.19 |
| 5,798,547 A | * | 8/1998 | Urai ....................... 365/185.33 |
| 6,567,305 B2 | * | 5/2003 | Nakamura .............. 365/185.11 |

FOREIGN PATENT DOCUMENTS

JP          7-169285          7/1995

* cited by examiner

Primary Examiner—Thong Q. Le
(74) Attorney, Agent, or Firm—Frommer Lawrence & Haug LLP

(57) ABSTRACT

A semiconductor memory device is provided with a memory cell, at least one select gate transistor and a circuit. The circuit is configured to rewrite data in the memory cell by applying a potential difference between the gate and the source or between the gate and the drain, which is larger than a power supply voltage. The circuit operates in a first data programming mode and a second data programming mode. A first command or a first combination is used for the first data programming mode. A second command or a second command combination is used for the second data programming mode. The source line is set to different potentials between the first data programming mode and the second data programming mode, in a period when data is rewritten, by using the different command or the different command combination.

62 Claims, 16 Drawing Sheets

SEMICONDUCTOR MEMORY DEVICE IN WHICH SOURCE LINE POTENTIAL IS CONTROLLED IN ACCORDANCE WITH DATA PROGRAMMING MODE

CROSS-REFERENCE TO RELATED APPLICATIONS

This application is a continuation of Ser. No. 09/876,744 filed Jun. 7, 2001 now U.S. Pat. No. 6,567,305.

This application is based upon-and clams the benefit of priority from the prior Japanese Patent Application No. 2000-173716, filed Jun. 9, 2000, the entire contents of which are incorporated-herein by reference.

BACKGROUND OF THE INVENTION

The present invention relator to a semiconductor memory device, and more-particularly to a non-volatile semiconductor memory device such as a NAND cell, a NOR cell, a DINOR cell, AND cell type EEPROM or the like.

Conventionally, as one semiconductor memory device, there is known an electrically rewritable EEPROM. Among such EEPROM's, a HAND cell type EEPROM which constitutes a NAND cell block by connecting in series a plurality of memory cells is noted as a type of EEPROM which enables a high degree of integration.

One memory call in the NAND cell type EEPROM has a PET-MOS structure in which a floating gate (charge storage layer) and a control gate are stacked on the semiconductor substrate via an insulating film. Then, a plurality of memory cells arranged adjacent to each other are connected in series in the form of shared sources and drains to constitute a NAND cell and the memory cells are connected to a bit line as one unit. Such HAND cells are arranged in a matrix to constitute a memory cell array. Memory cell arrays are integrated and formed on a p-type semiconductor substrate or in a p-type well region.

The drain on one end side of the NAND cell arranged in a column direction of the memory cell array is commonly connected to the bit line via a select gate transistor while the source on the other end side is connected to a common source line via the select gate transistor as well. A control gate of the memory transistor and a gate electrode of the select gate transistor are connected in common as the control gate line (word line) and the select gate line respectively in a row direction of the memory cell arrays.

This NAND cell type EEPROM operates in a manner as described below. An operation of programming data is conducted in order, primarily starting from a memory cell disposed at a location most remote from a bit line contact. In the beginning, when the operation of programming data is started, 0V ("1" data writing bit line) or a power supply voltage Vcc ("0" data writing bit line) is given to the bit line in accordance with the data to be written while Vcc is given to the select gate line on the side of the selected bit line contact. In this case, in the selected NAND cell connected to the "1" data writing bit line, a channel portion in the NAND cell is fixed to 0V via the selected gate transistor. On the other hand in the selected NAND cell connected to the "0" data writing bit line, the channel portion in the NAND cell is charged to [Vcc-Vtsg] (however, Vtsg denotes a threshold voltage) via the select gate transistor followed by being set to a floating state. After that the control gate line of the select memory cell in the select NAND cell is set to 0V→Vpp (=about 20V: a programing high voltage) while the other control gate line in the select NAND cell in set to 0V→Vmg (=about 10V: an intermediate voltage).

Since the channel portion in the NAND cell is fixed to in the select NAND cell connected to the "1" data writing bit line, a large potential difference (about 20V) is generated between the control gate line (=Vpp potential) of the select memory cell in the select NAND cell and the channel portion (=0V), and the injection of electrons is generated from the channel portion to the floating gate. As a consequence the threshold voltage of the selected memory cell is shifted in a positive direction to complete the "1" data writing.

In contrast, since the channel portion in the NAND is set to the floating state in the select NAND cell connected to the "0" data writing bit line, the potential of the channel portion rises to the [Vcc-Vtsg] potential→Vmch (=about 8V) while maintaining the floating state along with a rise in the voltage of the control gate line (0V→Vpp, Vmg) under the influence of the capacity coupling between the control gate-line and the channel portion in the select NAND cell. At this time, since the potential difference between the control gate line (Vpp potential) of the select memory cell in the select NAND cell and the channel pot ion (=Vmch) is set to a relatively mall level of about 12V, no injection of electrons is generated. Consequently, tho threshold voltage of the select memory cell does not change and is maintained in a negative state.

Data is erased simultaneously with respect to all the memory cells in the select NAND cell block. That is, all the control gate lines in the select NAND cell are set to 0V to apply a high voltage of about 20V to the bit line, the source line, the p-type well region (or the p-type semiconductor substrate), the control gate line in the non-select NAND cell block and all the select gate lines. Consequently, electrons in the floating gate are emitted to the p-type well region (or the p-type semiconductor substrate) in all the memory cells in the select RAND cell block so that the threshold voltage is shifted in a negative direction.

On the other hand, the operation of reading data is conducted by setting the control gate line of the selected memory cell to 0V, setting the control gate and the selected gate line of the other memory cell to the power supply voltage Vcc and detecting whether or not current flows in the select-memory cell.

As is apparent from the above explanation on the operation, in the NAND cell type EEPROM, the channel in the select NAND cell connected to the "0" data writing bit line is set to the floating state having a Vmch potential by using a capacity coupling with the control gate line at the time of the data programming operation when a leakage current to the source line via the select gate transistor on the source line side is large, the channel potential in the floating state is largely decreased, and the potential difference between the control gate and the channel of the select memory cell is increased. Thus, the possibility is increased that the injection of electrons from the channel to the floating gate is generated that is, the possibility is increased in that "1" data is erroneously written (hereinafter referred to as an error programming operation). Then, a technique for biasing a source line to a positive voltage of about Vcc is normally used at the time of a data programming operation in order to decrease the above leakage current.

By the way, in such NAND cell type EEPROMs, it is thought that a method is required for shortening the time required for programming and erasing data in all the memory cells in the chip by using an operation in which the number of memory cells in which "1" data is written at one time is larger than the normal data programming operation, in order to realize a decrease in the test cost as a result of shortening the time required for quality control testing such as in normal data programming and data erasing testing. For example, a mode for programming "1" data in one package in a plurality of blocks is provided for programming "1" data into a larger number of memory cells at one time than at the time of a normal data programming operation. Naturally, in the mode for programming "1" data into a plurality of blocks in a package, in a larger number of BAND cells than in the case of normal data programming, the channel portion is fixed to 0V while the source line is set to a positive voltage in the same manner as the normal data programming operation.

At the time of the above operation of programming data, in the select gate transistor provided on the source line side in the NAND cell connected to the "1" data writing bit line, a small amount of leakage current flows between the sources and drains in the state in which the sources and drains are set to the positive voltage and 0V, respectively while the control gate is set to 0V. Since the number of NAND cells in which the channel portion is set to 0V is relatively small in a normal data programming operation, the total amount of leakage current becomes so large that it causes no problem. However, since the number of NAND cells (that is, the number of ND cells in which the channel portion is set to 0V) which are selected at one time is far larger than at the time of normal data programming operation in the mode of programming "1" data in a plurality of blocks in one package. Thus, the total amount of leakage current because so large that it loads to errors in operation of chips resulting from an increase in consumed current at the time of reliability testing, as well as local per supply voltage drops in the chip, and an increase in noise.

In particular, when memory cells are more and more miniaturized, the gate length of the select gate transistor is shortened, and the possibility increases in which the leakage current via the select gate transistor is increased. Thus, the total quantity of the above leakage current is increased along with the miniaturization of the memory cell, and it is feared that this problem will become more and more serious.

In this manner, in a conventional NAND cell type EEPROM or the like, there are problems such as erroneous operation or the like resulting from increases in the consumed current as well as local power supply voltage drops in the chip or an increase in noise in order to shorten the time required for quality control testing and in order to increase the number of memory cells for data writing in one time data programming operation than at the time of normal operation.

Furthermore, there is a problem in that when the normal data programming operation is performed at the time of the reliability test in order to settle this problem, the required time of tho reliability test is prolonged, and the chip coot resulting from an increase in the test cost increase.

BRIEF SUMMARY OF THE INVENTION

A semiconductor memory device according to an aspect of the present invention comprises a memory cell having a gate, a source and a drain, at least one select gate transistor provided between a source line and the source of the memory cell, a circuit configured to rewrite data in the memory cell by applying a potential difference between the gate and the source or between the gate and the drain, which is larger than a power supply voltage, the circuit operating a first data programming mode and a second data programming mode, a first command or a first command combination which is used for the first data programming mode, and a second command or a second command combination which is used for the second data programming mode, wherein the first command or the first command combination is different from the second command or the second command combination, and the source line is set to different potentials between the first data programming mode and the second data programming mode, in a period when data is rewritten, by using the different command or the different command combination.

A semiconductor memory device according to another aspect of the present invention comprises a memory cell having a gate, a source and a drain, at least one select gate transistor provided between a source line and the source of the memory cell, a circuit configured to rewrite data in the memory cell by applying a potential difference between the gate and the source or between the gate and the drain, which is larger than a power supply voltage, the circuit operating a first data programming mode and a second data programming mode, and a first command or a first command combination which can change a potential of the source line in a period when data is rewritten, wherein the source line is set to different potentials between the first data programming mode and the second data programming mode, in a period when data is rewritten, by using the first command or the first command combination in the second data programming mode.

A semiconductor memory device according to still another aspect of the present invention comprises a memory cell having a gate, a source and a drain, at least one select gate transistor provided between a source line and the source of the memory cell, and a circuit configured to rewrite data in the memory cell by applying a potential difference between the gate and the source or between the gate and the drain, which is larger than a power supply voltage, the circuit operating a first data programming mode and a second data programming mode, wherein a source line potential in a period when data is rewritten is dependent on writing data to selected memory cells.

BRIEF DESCRIPTION OF THE SEVERAL VIEWS OF THE DRAWING

The accompanying drawings, which are incorporated in and constitute a part of the specification, illustrate presently preferred embodiments of the invention, and together with the general description given above and the detailed description of the preferred embodiments given below, serve to explain the principles of the invention.

DETAILED DESCRIPTION OF THE INVENTION

Figure 1:
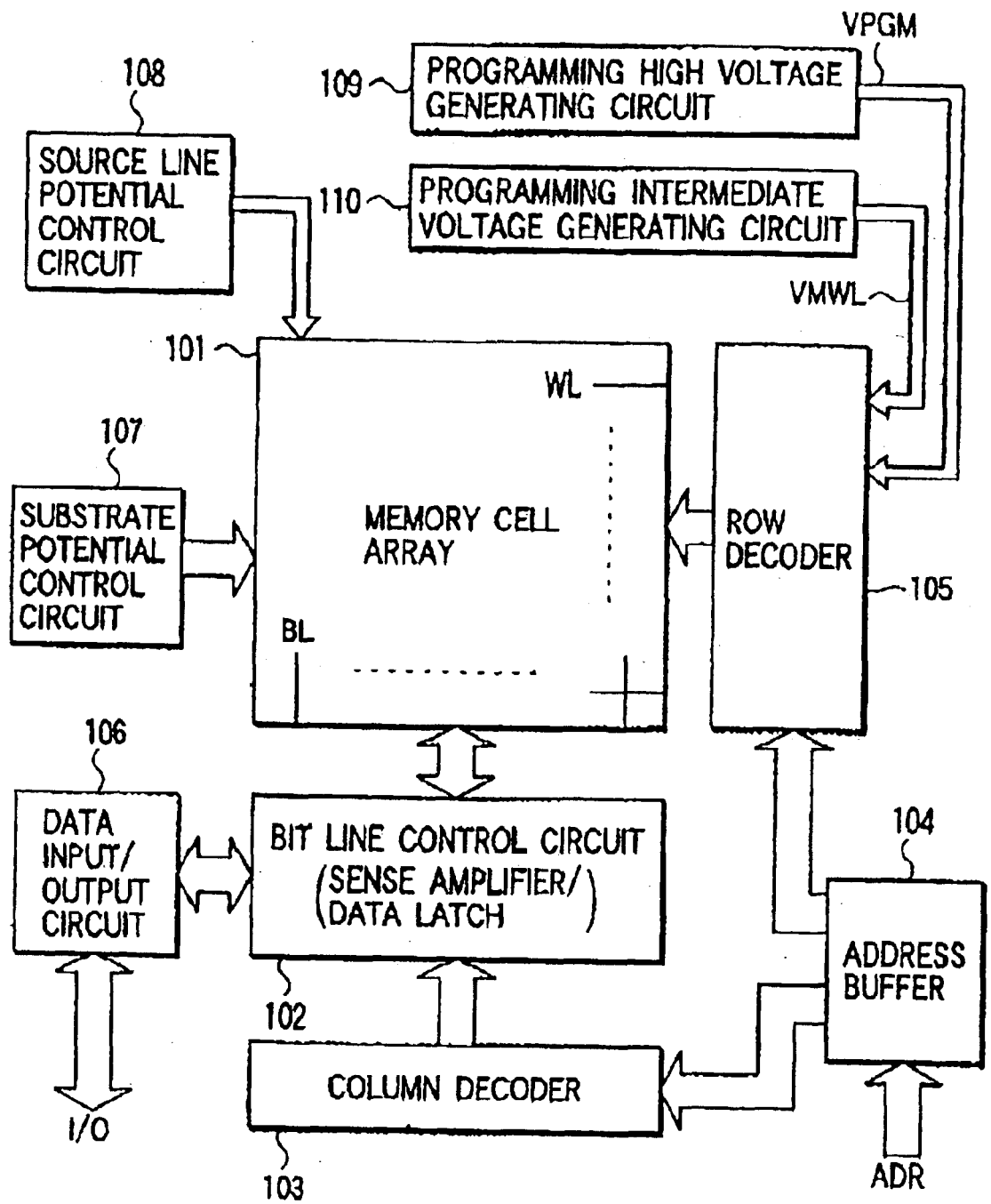
FIG. 1 is a block diagram showing a schematic structure of a NAND call type EEPROM, for explaining a semiconductor memory device according to one embodiment of the present invention.

FIG. 1 is a block diagram showing a schematic structure of an NAND cell type EEPROM, for explaining a semiconductor memory device according to one embodiment of the present invention. To a memory cell array 101, a bit line control circuit 102 is connected for conducting data writing, data reading, data rewriting and verify reading. This bit line control circuit 102 is connected to a data input/output buffer 106 to receive an output of a column decoder 103 for receiving an address signal ADR from an address buffer 104 as an input. Furthermore, to the memory cell array 101, a row decoder 105 is connected for controlling a control gate and a select gate line while a substrate potential control circuit 107 is connected for controlling a potential of a p-type silicon substrate (or a p-type well region) on which the memory cell array 101 is formed.

Furthermore, for controlling the source line potential in the memory call array 101, a course line potential control circuit 108 is provided. Furthermore, at the time of data programing operation, a programming high voltage generating circuit 109 and a programming intermediate voltage generating circuit 110 are provided in order to generate a programming high-voltage Vpp (about 20V), and an intermediate voltage Vmg (about 10V) respectively.

The above bit line control circuit 102 primarily comprises a CMOS flip-flop to conduct a sense operation for reading a latch of data and a potential of the bit line for writing, a sense operation for verify reading after writing, and a latch of data to be rewritten.

Figure 2A:
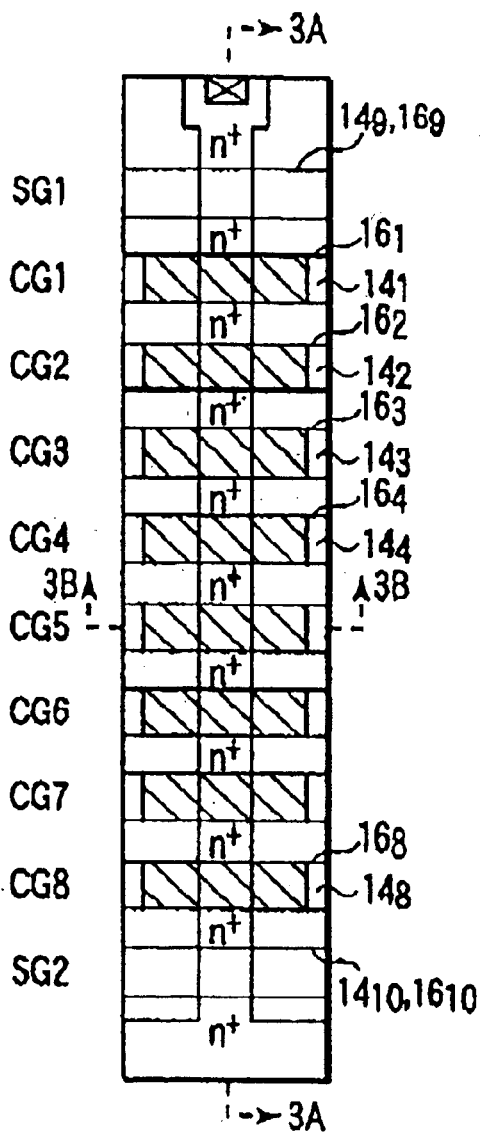
FIG. 2A is a pattern plan view showing one NAND cell portion in a memory cell array shown in FIG. 1.
Figure 2B:
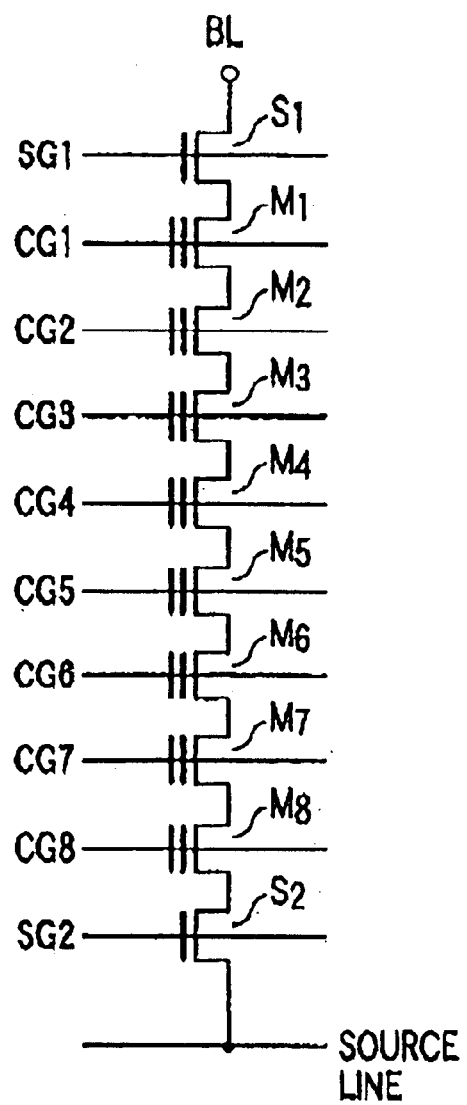
FIG. 2B is an equivalent circuit diagram showing one NAND cell portion in a memory cell array shown in FIG. 1.
Figure 3A:
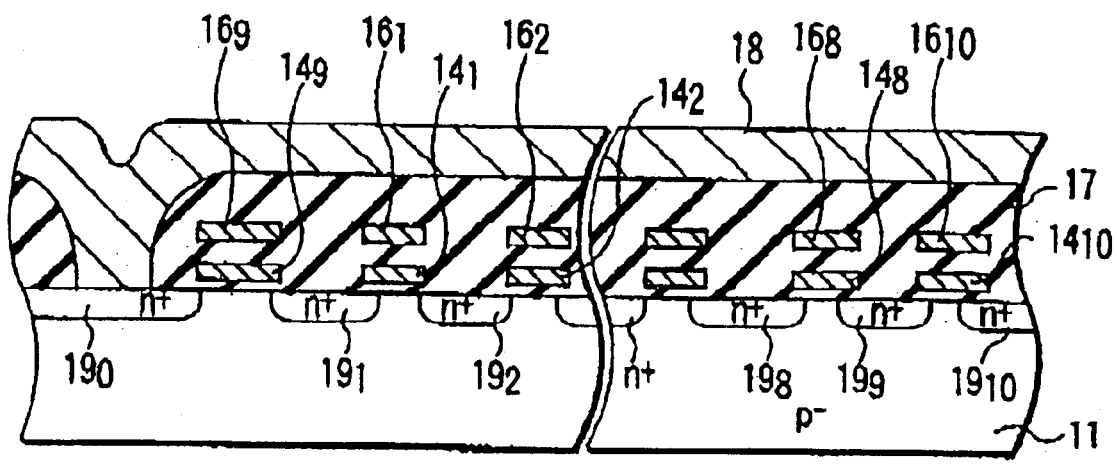
FIG. 3A is a sectional view taken along the line 3A—3A of FIG. 2A.
Figure 3B:
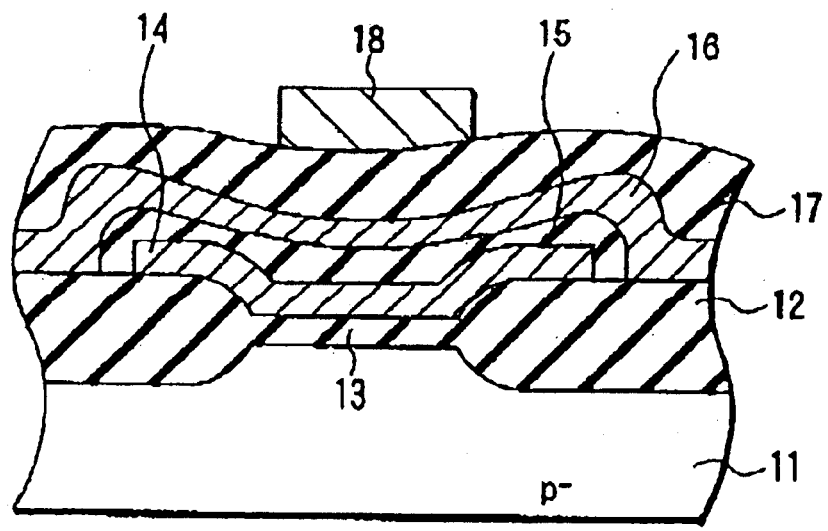
FIG. 3B is a sectional view taken along the line 3B—3B of FIG. 3A.

FIGS. 2A and 2D are a pattern plan view and an equivalent circuit diagram of one NAND cell portion in the above memory cell array respectively. FIGS. 3A and 3B are sectional views taken along lines 3A—3A and 3B—3B of FIG. 2A. A memory cell array comprising a plurality of NAND cells is formed on a p-type silicon substrate (or a p-type well region) surrounded with a field oxide film 12. In this embodiment eight memory cells $M_1$ through $M_8$ are connected in series to constitute one NAND cell.

Each of the memory cells is constituted in such a manner that floating gates 14 ($14_1$, $14_2$, ... $14_8$) are formed on the substrate 11 with a gate insulating film 13 intervened therebetween and the control gates 16 ($16_1$, $16_2$, ..., $16_8$) are formed on the floating gates via the insulation film 15. The n-type diffusion layers 19 ($19_0$, $19_1$, ..., $19_{10}$) which are sources and drains of these memory cells are such that the Adjacent sources and adjacent drains are connected respectively in the form of sharing sources and drains so that these memory cells are connected in series.

On the drain side and the source side of the above NAND gates, the select gates $14_9$, $16_9$ and $14_{10}$, $16_{10}$, formed by the same process as the floating gates and the control gates of the memory cells are provided respectively. The above select gates $14_9$, $16_9$ and $14_{10}$, $16_{10}$ are electrically connected in a region not shown, respectively. The upper surface of the substrate 11 on which the devices are formed is covered with a CVD oxide film 17 and bit lines 18 are forced on the CVD oxide film 17. These bit lines 18 are allowed to come into contact with a diffusion layer 19 on the drain side of the NAND cell. The control gate 16 of the NAND cells which are arranged in a row direction are commonly arranged as the control gate lines CG1, CG2, ..., CG8. These control gates constitute word lines. The select gates $14_9$, $16_9$ and $14_{10}$, $16_{10}$ are also arranged as select gate lines SG1 and SG2 continuously in a row direction respectively.

Figure 4:
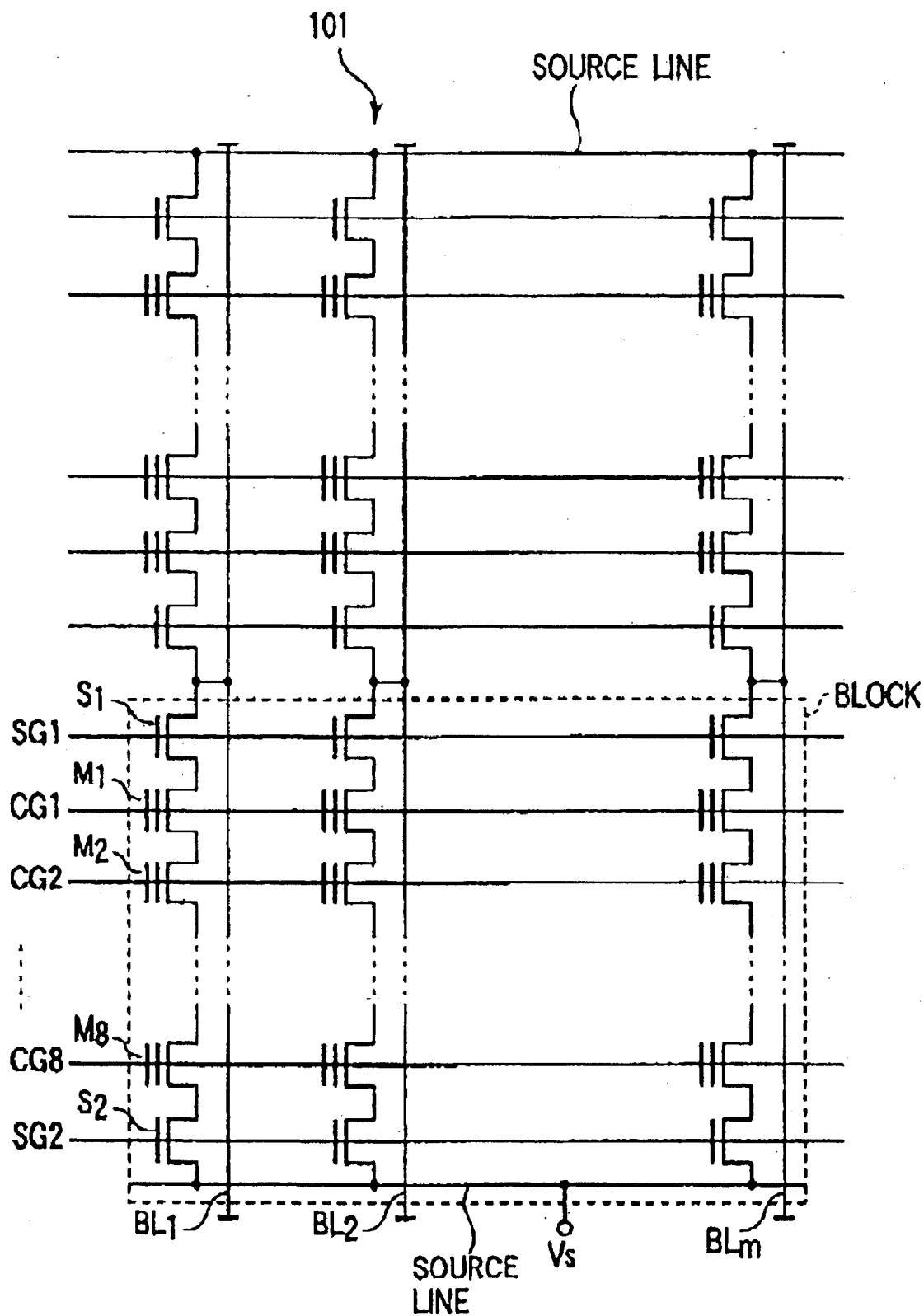
FIG. 4 is an equivalent circuit diagram showing a memory cell array in which the HAND cells are arranged in matrix in the same manner.

FIG. 4 is a view showing an equivalent circuit of a memory cell array on which such NAND cells are arranged in a matrix. A NAND cell group sharing the same word line and the select gate line is referred to as a block. The region surrounded by a broken line in FIG. 4 is defined as one block. At the time of normal reading and programming, only one of a plurality of blocks is selected (referred to as a selected block).

Figure 5:
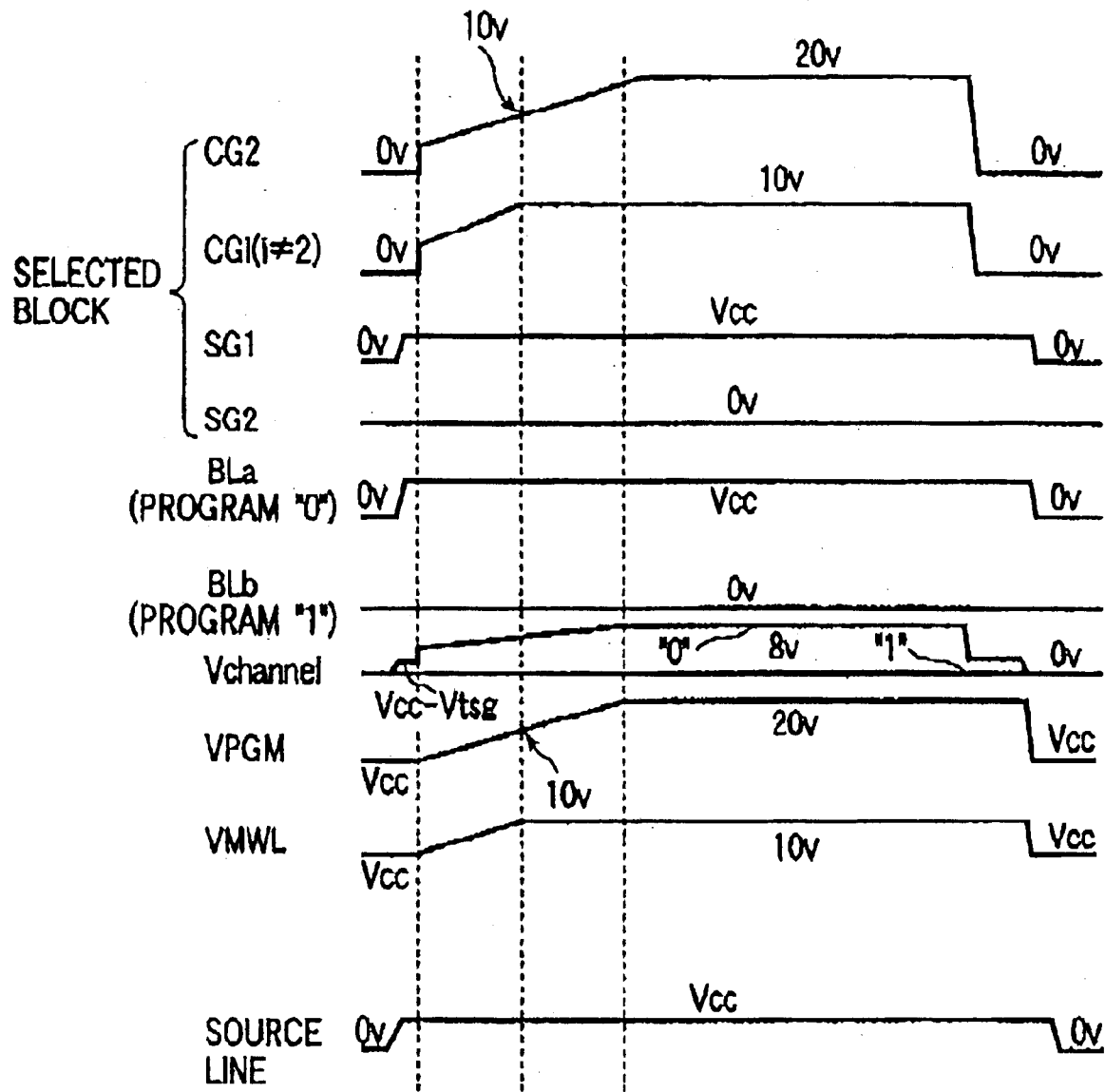
FIG. 5 is a timing chart showing a data programming operation.

FIG. 5 is a view showing a timing chart representing a normal data programming operation. Incidentally, there will be explained a case in which CG2 is selected out of eight control gate lines CG1 through CGB in the NAND cell. In a normal data programming operation, when the operation is started, the select gate line SG1 on the bit line contact side in the select block is set to 0V→Vcc in the beginning while the "0" data writing bit line is also set to 0V→Vcc. Thus, the channel portion potential Vchannel of the NAND cell connected to the "0" data writing bit line in the select block is set to 0V→[Vcc-Vtsg]. Besides, the source line-potential set level in the memory cell array 101 is set to 0V→Vcc with the control of the source line potential control circuit 108. Consequently, the charging of the selected control gate line CG2 is started with the programming high voltage VPGM (about 20V) output from the programming high voltage generating circuit 109 while the charging of the other control gate line CGi (CG1, CG3 through CG8) is started with the programming intermediate voltage VMWL (about 10V) output from the programming intermediate voltage generating circuit 110. After the charging is completed, the voltage of each control gate line is maintained for some time, the threshold voltage of the memory cell for programming "138 data is shifted in a positive direction so that data programming is conducted. After that, the voltage of each control gate line is lowered to 0V, followed by setting the select gate line SG1, the bit line BLa for "0" data writing and the source line to 0V respectively, which completes the data programming operation.

When the control gate line during the above normal data programming operation is set to 20V or 10V, the channel portion potential Vchannel is fixed to 0V in the NAND cell connected to the "1" data writing bit line BLb and the channel portion potential Vchannel is set in a floating state at a potential of about 8V under the influence of a capacity coupling between the control gate lines CG1 through CG8 and the channel portion potential Vchannel in the NAND cell connected to the "0" data writing bit line BLa.

Consequently, in the "1" data writing memory cell, the potential difference between the control gate and the channel is set to a high level of about 20V so that the injection of electrons into the floating gate is generated. In contrast, the potential difference between the control gate and the channel is set to a relatively low level of about 12V in the "0" data writing memory cell so that no injection of electrons is generated.

Since the channel portion potential Vchannel in the NAND cell connected to the "0" data writing bit line BLa is set to a floating state, the potential which should be set to about 8V is lowered if the leakage current, Such as Vchannel→source line is large. Since the potential difference between the; control gate and the channel of the select memory cell becomes large, the possibility increases in which the injection of electrons is erroneously generated. In order to avoid this possibility, at the time of a normal programming operation, as shown in FIG. 5, the leakage current of Vchannel→source line is largely decreased by setting the source line potential to a positive voltage of Vcc.

In the NAND cell type EEPROM as described above, a mode for programming "1" data into a plurality of blocks in a package at one time into a larger number of memory cells than of a normal data programming operation is provided in addition to normal data programming in order to shorten the time required for quality control testing such as data programming and erasure. This mode of programming "1" data into a plurality of blocks at one time is an operation of simultaneously selecting a plurality of blocks at one time and programming "1" data at one time into all the memory calls in the select block. Naturally, in the mode of programming "1" data at one time into all the memory cells in the selected blocks, the channel portion is fixed to 0V in larger number of NAND cells than in a normal data programming operation.

Figure 6:
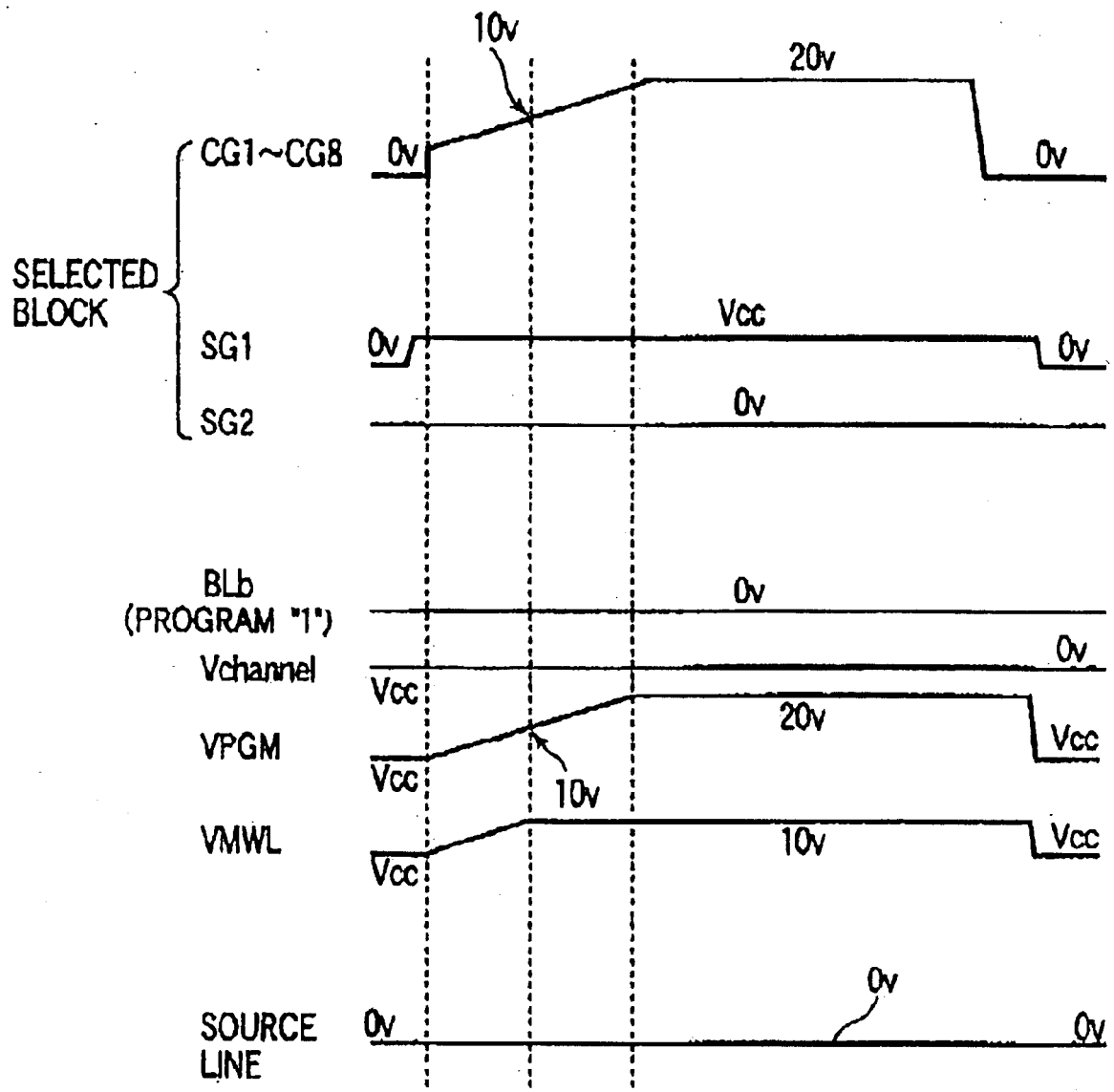
FIG. 6 is a timing chart showing a data programming operation in a semiconductor memory device according to a first embodiment of the present invention.

Next, the mode of programming "1" data into the plurality of blocks in a package will be explained from the timing chart of FIG. 6. In FIG. 6, points different from FIG. 5 are that all the control gate lines CG1 through CG8 are selected (20V is applied thereto), the waveform of the bit line (the bit line BLb for programming "1" data) and the channel portion Vchannel is one respectively, and the source line potential set level is changed over with the source line potential control circuit 108 and the source line is fixed to 0V.

In the mode of programming "1" data into a plurality of blocks in a package, "1" data writing is conducted at one time with respect to all the memory cells in the selected plurality of blocks so that the required time for quality control can be greatly reduced. In the mode of programming "1" data into a plurality of blocks at one time, since no bit line BLa for programming "0" data is present, the channel portion potential Vchannel of the NAND cell in the select block is all in the state of being fixed to 0V. Consequently, since it is not required to worry about the potential drop of the channel portion potential Vchannel in the NAND cell for programming "0" data resulting from the leakage current, no problem is caused when the source line set level is fixed to 0V.

Figure 7:
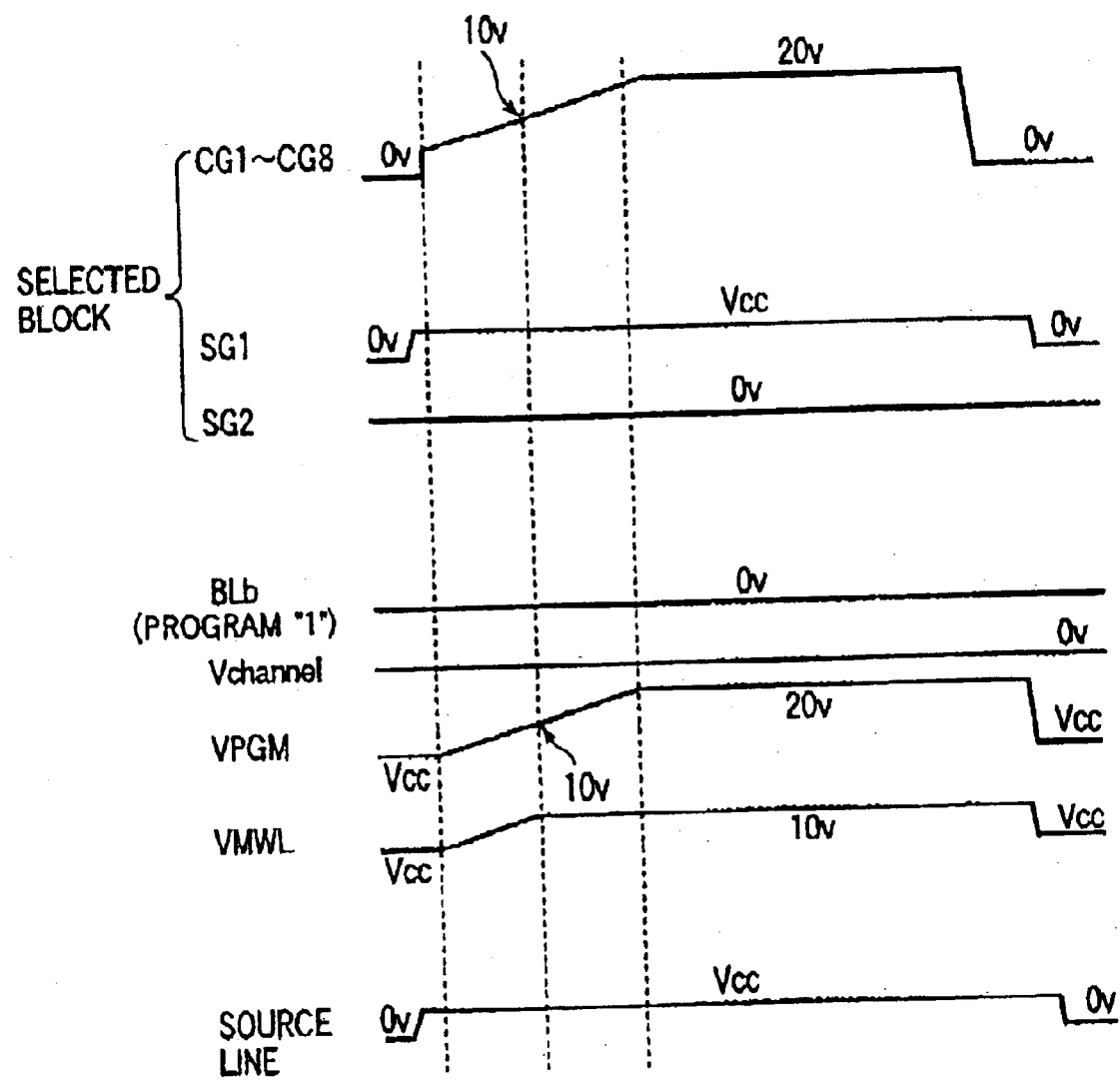
FIG. 7 is a timing chart showing a conventional data programing operation.

In contrast, in the NAND cell type EEPROM having a structure as shown in FIGS. 1, 2A, 2B, 3A, 3B and 4, at the time of conducting the mode of programming "1" data into a plurality of blocks in a package, the source line is set to a power supply voltage Vcc in the same manner as in the-normal data programming operation (see the timing chart of FIG. 7). In the select gate transistor $S_2$ on the source line side in the NAND cell connected to the "1" data writing bit line BLb, the source and the drain are set to a positive value-and 0V, respectively while the gate is set to 0V, a small quantity of leakage current flows between the sources and drains. In the normal data programming operation, the number of NAND cells in which the channel portion is set to 0V is relatively small, the total leakage current is so small that it causes no problem. However, in the mode of programming "1" data into a plurality of blocks in a package, since the number of NAND cells selected at one time (namely, the number of NAND cells in which the channel portion is set to 0V) is far larger than at the time of normal data programming operation, the total leakage current becomes large so that there a rise such problems as the erroneous operation of chips resulting from an increase in the consumed current at the time of quality control, and a local power supply voltage drop in the chip and an increase in noise.

In particular, as memory cells are more and more miniaturized, the gate length of the select gate transistor is also shortened so that the possibility increases in which the leakage current via the select gate transistor $S_2$ increases. Consequently, the total leakage current also increases so that it is feared the problem will become more serious.

However, the potential difference between the sources and drains of the select gate transistor $S_2$ on the source line side is eliminated by using the method as shown in FIG. 6 with respect to the mode of programming "1" data into a plurality of blocks in a package. Thus, it is possible to prevent the generation of the leakage current via the select gate transistor-on the source side at the time of the mode of programming "1" data into a plurality of blocks at one time so that conventional problems can be settled. Consequently, the reliability of the operation at the time of the miniaturization of the memory cell can be heightened.

In this manner, the generation of a large leakage current, which conventionally causes a problem at the time of the mode of programming "1" data into a plurality of blocks in a package by setting the source line potential at the time of programming "1" data into a plurality of blocks in a package than at the time of the normal data programming operation, can be prevented. Thus, problems in quality control testing of the mode for programming "0" data into a plurality of blocks in a package are eliminated. As a consequence, a large reduction of the required time for the reliability test can be realized. Thus, it is possible to realize a more highly reliable and cheaper chip than conventionally by using the present invention.

It is assumed that the problem of the large leakage current at the time of the mode of programming "1" data into a plurality of blocks in the conventional method as described above becomes more and more serious with an increase in the degree of integration of the semiconductor device. That is because the gate length of the select gate transistor S2 on the source line side is reduced as the degree of integration is improved, so that the leakage current between sources and drains of the select gate transistor $S_2$ on the source line side is increased. When the mode of programming "1" data into a plurality of blocks in a package is not used in order to prevent this problem, the time of the reliability test is further increased as a result of an improvement in the degree of integration so that a large problem is caused as well. Consequently, it can between that a merit of using this invention becomes larger and larger with an improvement in the degree of integration.

As has been described above, a semiconductor memory device according to the present invention has been explained by using one embodiment of the present invention various modifications can be made.

Figure 8:
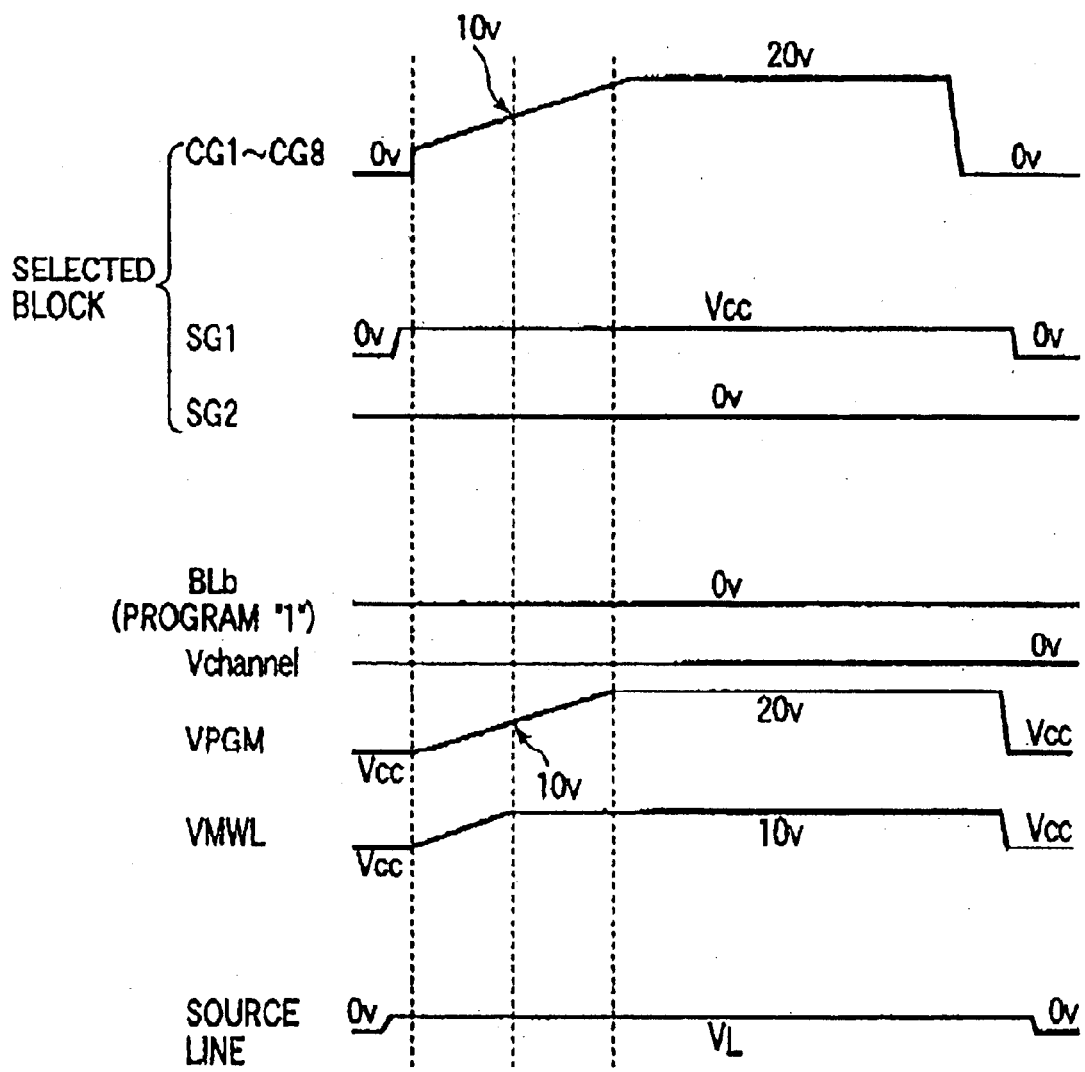
FIG. 8 is a timing chart showing a data programming operation in a semiconductor memory device according to a second embodiment of the present invention.

For example, in FIG. 6, there is shown an example in which the source line potential at the time of the mode of programming "1" into a plurality of blocks in a package is set to 0V. In an other case, for example, as shown in FIG. 8, the leakage current can be decreased lower than that of the conventional method and can be made effective even in the case where the source line potential set level is set to $V_L$ (0V<$V_L$<Vcc) at the time of the mode of programming "1" data into a plurality of blocks in a package. In the method of FIG. 8, the source line potential at the time of programming "1" data into a plurality of blocks in a package is low as compared with the conventional method, so that the leakage current in the channel of the "source line ($V_L$ potential)→the select gate transistor $S_2$ on the source line side (gate=0V) →the channel portion (potential Vchannel=0V)" becomes small. Thus, the mode-of programming "1" data into a plurality of blocks in a package can be used.

Figure 9:
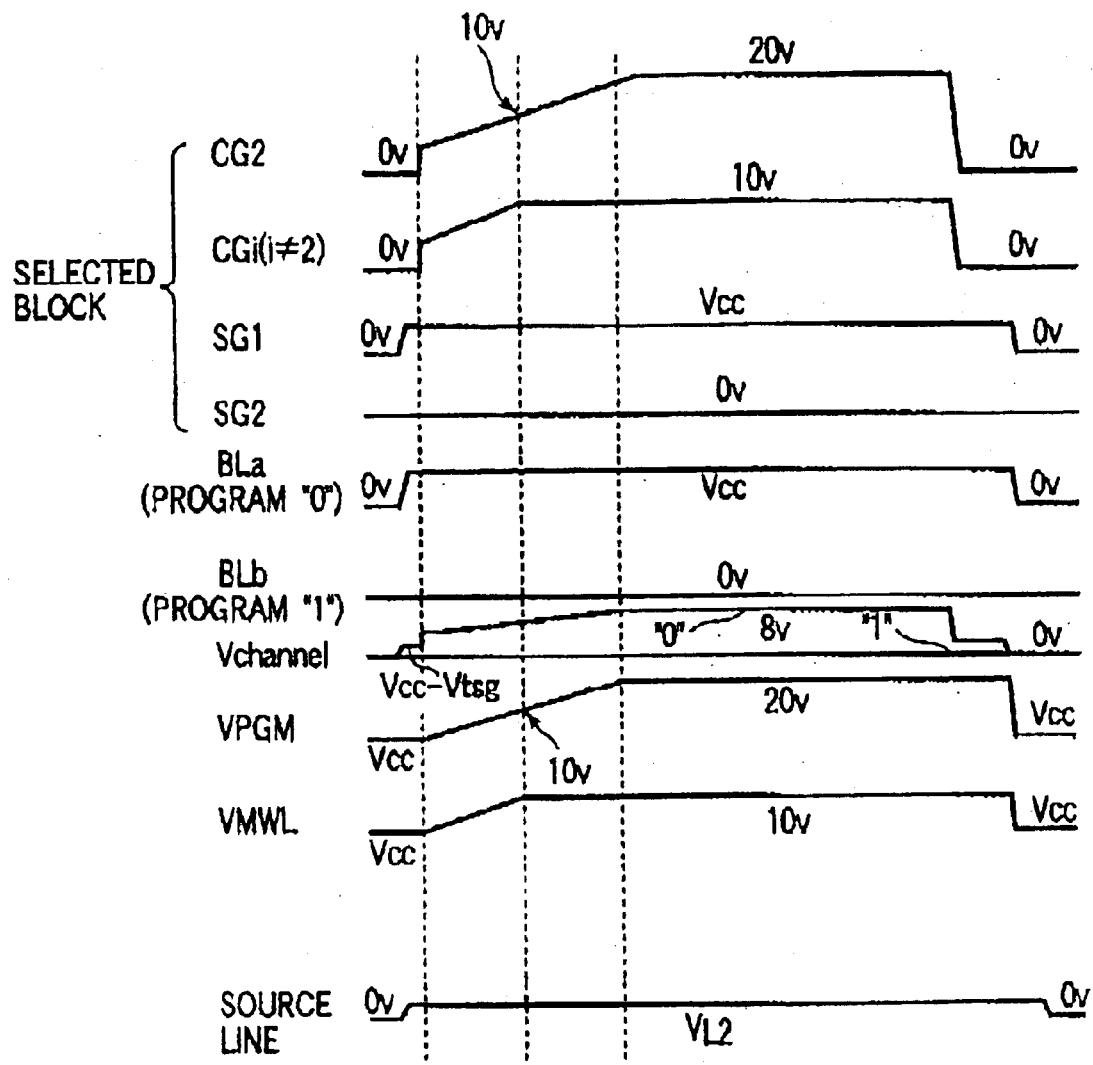
FIG. 9 is a timing chart showing a data programming operation in a semiconductor memory device according to a third embodiment of the present invention.

Additionally, also in the case where the source line potential set level at the time of the normal data programming operation as shown in FIG. 9 is $V_{L2}$ (>0V) instead of Vcc, the leakage current in the channel of "the source line→the select gate transistor on the source line size (gate=0V)→the channel portion (potential Vchannel=0V)" is set to a lower level at the time of the mode of programming "1" data into a plurality of blocks in package than at the time of normal data programming operation by setting the source line potential set level at the mode of programming "1" data into a plurality of blocks in a package to 0V or $V_L$ (<$V_{L2}$) as shown in FIGS. 6 or 7. Thus, it is possible to use the mode of programming "1" data into a plurality of blocks in a package.

Furthermore, also in the case where the bit line voltage at the time of programming "1" data is set to Vo (>0V) instead of 0V, the method is effective in which the source line is set to a lower level at the time of the mode of programming "1" data into a plurality of blocks in a package than at the time of normal data writing. In particular, in the case where "the bit line voltage=the source line voltage" is set at the time of package operation, the leakage current can be completely eliminated, so that the method becomes extremely effective.

In each of the above embodiments, the present invention hag been explained by taking, as an example an embodiment in the ease where in the normal data programming operation and the mode of programming "1" data into a plurality of blocks in a package (a, plurality of selected blocks select all the control gate lines in the selected blocks at one time ("1" data is written into all the memory cells in the selected blocks)), the source line potential in the latter mode is lower than at the former operations. In an other case, the present invention is effective also where the source line potential is lower, for example, at the time of the mode of programming "1" data of a single control gate line in a plurality of blocks (an operation of simultaneously selecting the plurality of blocks, selecting only all the memory cells connected to the control gate line (for example, CG2) selected one by one in the selected plurality of blocks. respectively to conduct an operation of programming "1" data in a package) instead of the mode of programming "1" data into a plurality of blocks in a package than at the time of a normal data programming operation. The mode of programming "1" data of the single control gate line in the plurality of blocks is an operation of selecting at one time a larger number of blocks than at the time of the normal data programming operation. As one example of the embodiment of the present invention, there is a case in which the norm data programming operation uses the method of FIG. 6 while the mode of programming "1" data of the single control gate line in a plurality of blocks uses the method of FIG. 10. Since the source line potential is set to a lower level in this case than In the conventional example (the method of FIG. 12) of the mode of programming "1" data of the single control gate line in the plurality of blocks so that the total quantity of the leakage current can be decreased. Furthermore, at the time of conducting quality control testing, an operation of programming "1" into larger number of memory cells at one time can be realized than the normal data programming operation in the case of using the mode of programming "1" data of the single control line in this plurality of blocks in the same manner as the case of using the mode of programming "1" data into a plurality of blocks in a package, so that a reduction in quality control testing time can be realized.

Figure 10:
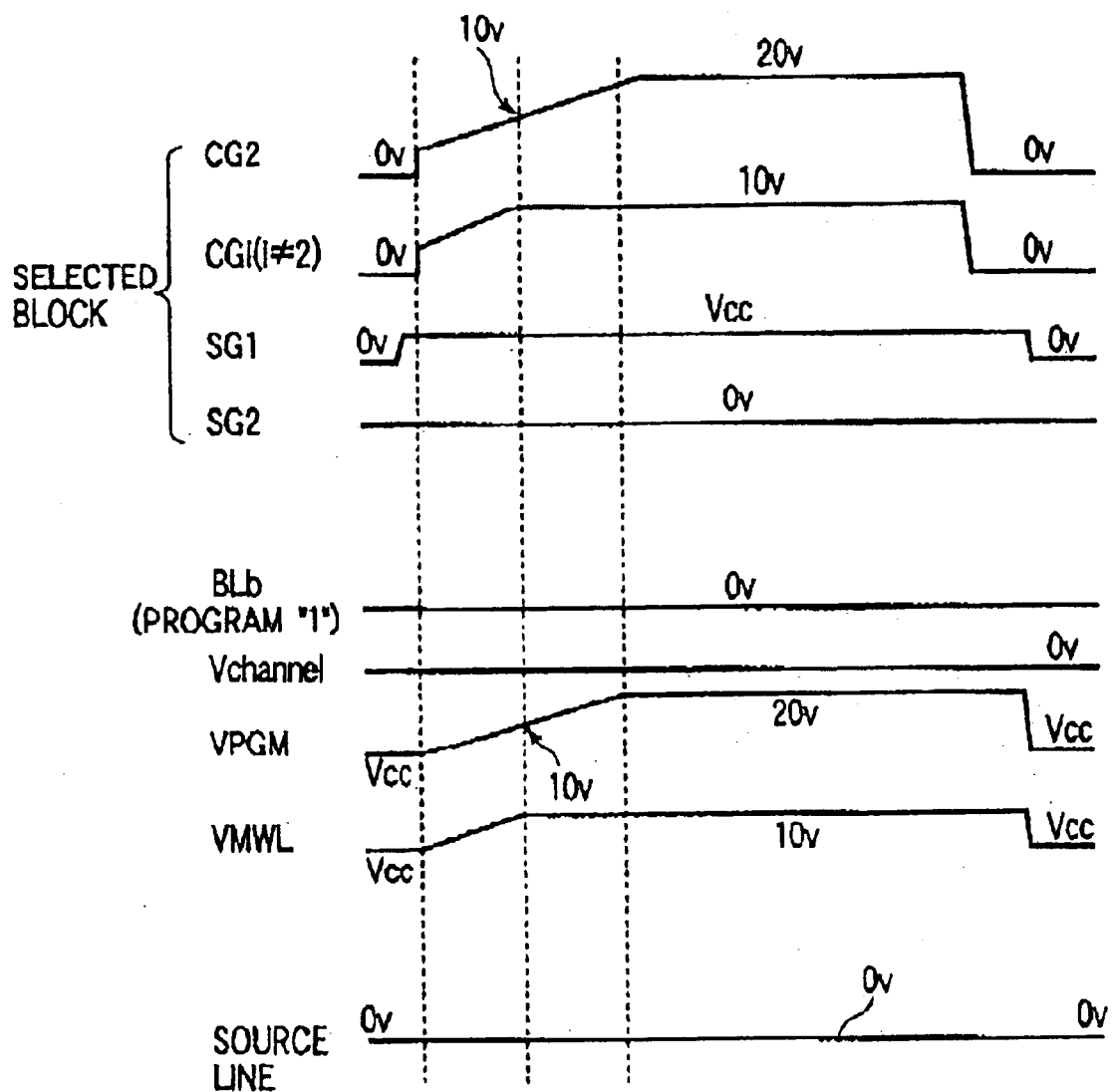
FIG. 10 is a timing chart showing a data programming operation in a semiconductor memory device according to a fourth embodiment of the present invention.
Figure 11:
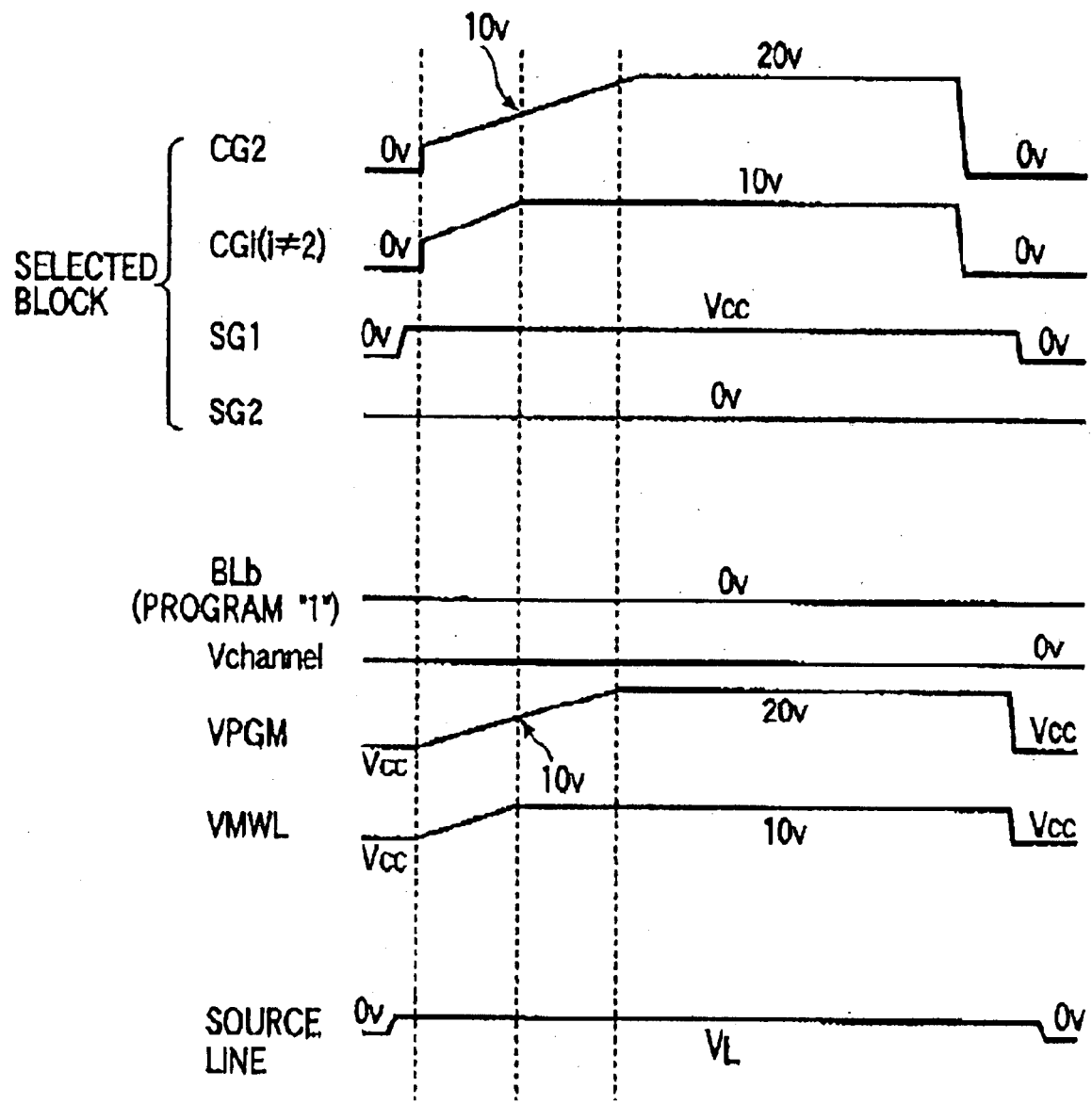
FIG. 11 is a timing chart showing a data programming operation in a semiconductor memory device according to a fifth embodiment of the present invention.
Figure 12:
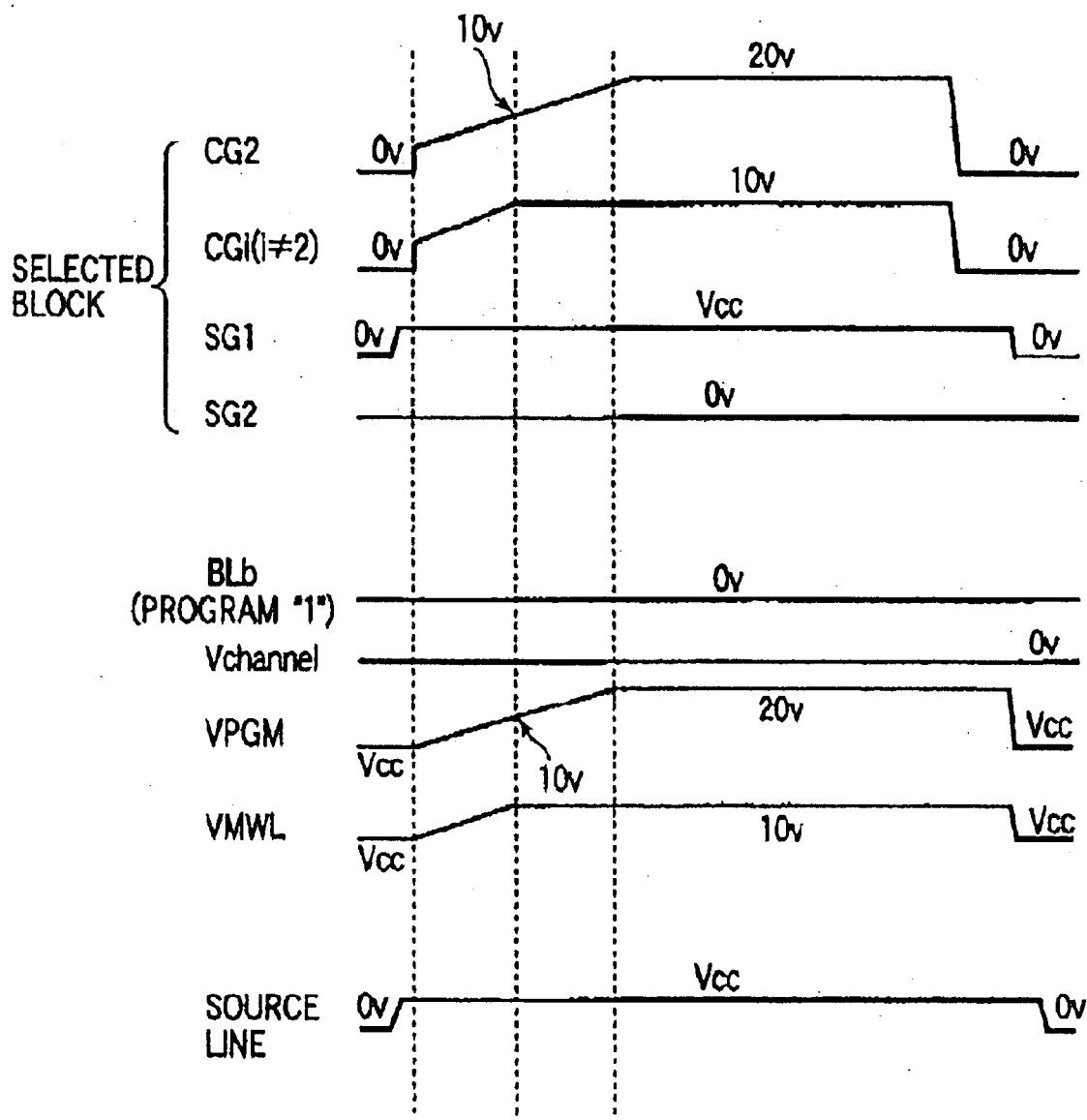
FIG. 12 is a timing chart showing a conventional data programming operation.

Furthermore, also in the case where the method of FIG. 11 is used instead of the method of FIG. 10, the source line potential is set to a lower level as compared with the case of using the method of FIG. 12 which is a conventional method, so that the total quantity of leakage current can be decreased.

In the above embodiment, as a method of realizing writing a larger quantity of data than at the normal data programing operation, two methods, a method of programming at onto time all tho memory cell by simultaneously selecting a plurality of blooks (FIGS. 6 and 8), and a method of programming all the memory cells connected to the control gate line selected one by one at each block by simultaneously selecting the plurality of blocks (FIGS. 10 and 11) are taken as an example to explain the present invention. However, in other cases, it goes without saying that two to seven control gate lines are simultaneously selected, for example, in each of blocks and "1" data is written at one time.

Furthermore, even in the case where the number of blocks which are selected at one time is one, a method is effective which decreases the leakage current by setting the source line potential to a lower value than at the time of the normal data programming operation in a similar manner as the case of FIGS. 6, 8, 10 and 11 because no NAND cell is present for programming "0" data in the select NAND cell with respect to the case of programming "1" data in a package with respect to one to eight selected control gate lines in the selected blocks.

Furthermore, it goes without saying that the present invention is also effective also in the case where the plurality of blocks correspond to all the blocks in one cell array, or all the blocks in the chip. In this case, since it is possible to set particularly the number of memory cells for data programing to be large no that the invention becomes the most effective means for realizing a great reduction In the time required for quality control testing.

Furthermore, in the case where the plurality of blocks are all the blocks excluding defective blocks in one cell array, or all the blocks excluding defective blocks in the chip. In the case where a method of simultaneously writing data into a plurality of blocks is conducted, it is extremely effective to set the source line potential to a value lower than at the time of normal data programming operation. In this manner, an operation failure resulting from the leakage current generated in the defective block can be prevented by rendering only defective blocks unselective, so that a highly reliable operation can be realized. Except for the method of rendering only defective blocks unselective, a method of rendering only "defective blocks+defective bit lines" unselective is also effective, In this case, the leakage current resulting from defective bit lines can be prevented, so that a highly reliable operation can be realized.

Still furthermore, there is available a method of changing the source line potential set level in accordance with the number of selected blocks by the source line potential control circuit 109 at the time of the data programming operation. For example, a method becomes effective for getting the potential to a relatively high level (for example, $V_{L2}$ to Vcc) in the case where the number of selected blocks is one while setting the potential to a relatively low level (for example, 0V to $V_L$) in the case where the number of selected blocks is two or more. Naturally, in other cases, the present invention is effective even in the case where the number of selected blocks at the boundary of changing, for example, the source line potential is set to an arbitrary value such as $10/11$ or $100/101$ instead of ½. Furthermore, it is effective to use a method of lowering the source line potential set level with an increase in the number of selected blocks.

Furthermore, as another method associated with the setting of the source line potential at the time of the data programming operation, there is available a method of changing the set level in accordance with the data to be written. For example, a method is effective which sets the source line potential to a relatively low level in the case where all the data to be written is "1" data while sets the source line potential to a relatively high level in the case where data to be written includes "0" data irrespective of the number of selected blocks and the number of memory cells in which data is written at one time.

Furthermore, a method is also effective which changes the source line potential set level with a combination of the number of selected blocks and the data to be written. For example, a method is effective which always sots the source line potential to a relatively high level when the number of selected blocks is a certain value or less (for example, one), sets the source line potential to a relatively higher level when the data to be written is includes "0" data and sets the source line potential to a relatively lower level when the data to be written is all "1" data.

Next, there will be explained a method of starting up the data programming operation. As one method of starting up the data programming operation in the nonvolatile semiconductor memory device such as the NAND type EEPROM or the like, a command method is available. In the normal data programming operation, the operation is started up with an input of the command into the chip as in a procedure of 1) "an input of an operation command of inputting data to be written"→"an input of an address"→"an input of data to e written"→"an input of a command of data programming operation"→the start of an normal data programming operation.

In contrast, examples of a method of realizing a simultaneous selection of a plurality of blocks areas follows:

2) "an input of a command of simultaneously selecting a plurality of blocks"→"an input of an operation command of an operation of inputting-data to be written→"an input of an address"→"an input of data to be written"→"an input of a command of a normal data programming operation"→the start of an operation of simultaneously writing normal data into a plurality of blocks;

3) "an input of a command of simultaneously selecting a plurality of blocks"→"an input of a command of normal data programming operation"→the start of an operation of simultaneously writing data into a plurality of blocks;

4) "an input an operation command of simultaneously writing the selected data into a plurality of blocks"→the start of a simultaneous data programming operation into a plurality of blocks.

The procedure 2) is an operation in which "an input of a command of simultaneously selecting a plurality of blocks" is added prior to the procedure 1). A block selection technique is designated which is different from the normal time operation with this command. That is, in 2), the source line potential set level is controlled with "an input of a command of simultaneously selecting a plurality of blocks". The procedure 3) is an operation in which "an input of an operation command of inputting data to b written", "an input of an address" and "an input of data to be written" are omitted from the procedure 2). At the time of using the method of 3), the data to be written and the memory cell for programming are determined in advance. (For example, the data to be written is all "1" while the memory cell for programming is all the memory cells in the memory cell or in the chip). In the method of 4), two commands of "an input of a command of simultaneously selecting a plurality of blocks" and "an input of a command of a normal data programming operation" are replaced with one command. The other operations are the same as those in 3). In the method of 4), the source line potential set level is controlled with the source line potential control circuit 108 with "an input of a command of simultaneous writing the selected data into a plurality of blocks".

The following method can be considered when considered on the basis of 1) through 4). As a method of setting the source line potential at the time of simultaneously selecting a plurality of blocks to a lower value than at the time of the normal data programming operation, there it available a method in which the source line potential at the time of the subsequent data programming operation (a plurality of blocks are selected) is set to a lower value than at the time of the normal data programming operation in the case where "a command of simultaneously selecting a plurality of blocks" and "an operation command of simultaneously writing the selected data into a plurality of blocks" are input. The control of the set value of the source line potential of the data programming operation can be easily realized by using this method. Furthermore, in the case of 2), as long as the data to be written which is input at the time of data input is all "1", the source line potential at the subsequent data programming operation is set to a lower value than at the normal-data programming operation. Thus, the set value of the source line potential at the time of data programming operation can be easily controlled by using this method.

Furthermore, there is available A method of using a command for setting the-source line potential. In this case, the above 2) through 4) can be given as 5) through 7) respectively.

5) "an input of a command for setting the source line potential"→("an input of data for setting the source line potential"→) "an input of a command of simultaneously selecting a plurality of blocks"→"an input of an operation command of inputting data to be written"→"an input of an address"→"an input of data to be written"→"an input of a command of a normal data programming operation"→the start of an operation of simultaneous data programing into a plurality of blocks;

6) man input of a command of setting the source line potential→("an input of data for setting the source line potential→) "an input of a command of simultaneously selecting a plurality of blocks"→"an input of a command of a normal data programming operation"→the start of an operation of simultaneous writing of data into a plurality of blocks 7) "an input of a command of verifying the source line potential"→("an input of data for setting the source line potential"→) "an input of an operation command of simultaneously writing the selected data into a plurality of blocks"→the start of an operation of simultaneously writing data into a plurality of blocks.

In this case, there arises a relationship between "an input of a command of simultaneously selecting a plurality of blocks" or "an input of a command of simultaneously writing the selected data into a plurality of blocks" and the source line potential set level.

Incidentally, in this case, in addition to the method for designating the source line potential set level with "an input of a command of setting the source line potential" and the type thereof (a case in which "an input of data for setting the source line potential" in 5) through 7) is absent), the method for designating the source line potential cat level by the data of "an input of data for setting the source line potential" after "an input of a command of setting the source line potential" (a case in which an input of data for setting the source line potential" in 5) to 7) is present) can be also realized and is effective. Additionally, various methods such as the lowering of the source line voltage set value only at the time of inputting "a command of programming "1" data in a package" or "a command of setting all the data to be written to "1"" or the like can be realized.

As has been described above, a method for changing the source line potential set level depending upon the type of the data programming operation is very effective. As a control method, various methods can be realized such as a method for controlling the selected data by referring the selected blocks or the number of memory cells, a method for controlling the set level depending on the writing data (whether all is "1" data or not), a method for controlling the selected data depending upon the type of the command and the like. In any case, as has been described above, the fact that there is provided a special data programming mode in which the source line potential set level is in a lower state as compared with at the normal data programming operation constitutes a large merit.

In each of the above embodiments, the present invention has boon explained by taking an example of the data programming operation. However, the present invention is not limited thereto. It goes without saying that a method similar to that used at the time of the data programing operation can be used such as changing the source line potential set level at the time of the single block selection and at the time of the selection of the plurality of blocks with respect to the data reading operation or data erasing operation.

Furthermore, there has been explained a case in which the number of memory cells connected in series in one NAND cell is 8. However, the present invention can be also applied to a case in which the number of memory cells connected in series is, for example, 2, 4, 16, 32 and 64 instead of 8. Furthermore, the present invention can be also applied to the case in which the number of memory cells between the select gate transistors is one. Furthermore, in the above embodiment, the present invention has been explained by taking an example of the NAND cell type EEPROM, but the present invention is not limited to the above embodiment. The present invention can be applied to other devices such as an NOR cell type EEPROM, a DINOR cell type EEPROM, an AND cell type EEPROM and an NOR cell type EEPROM attached with a select transistor or the like.

Figure 13:
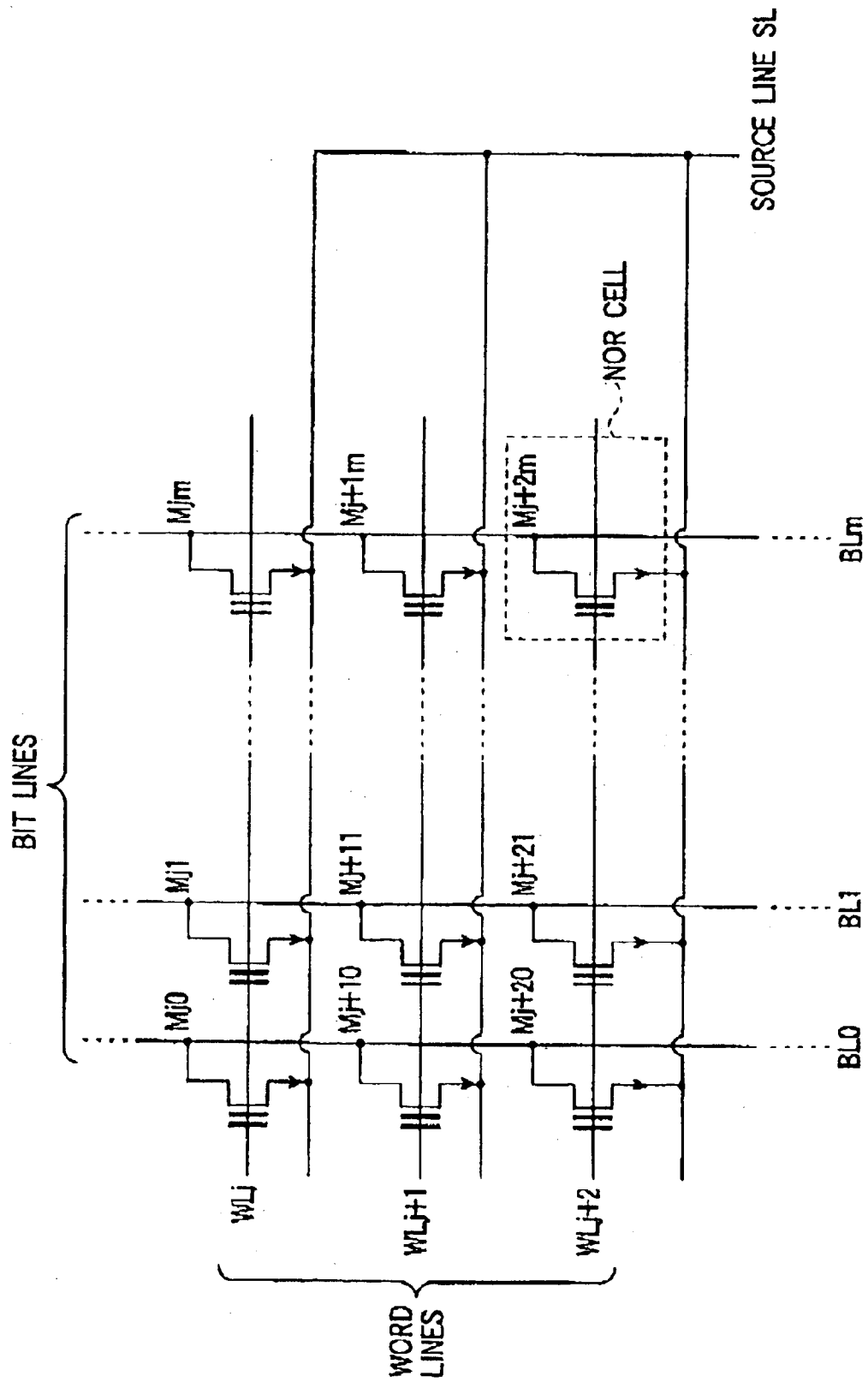
FIG. 13 is an equivalent circuit diagram showing an memory cell array in the NOR cell type EEPROM, for explaining a semiconductor device according to a sixth embodiment of the present invention.

FIG. 13 is an equivalent circuit diagram showing a memory cell array in the NOR cell type EEPROM. This memory cell array is constituted in such a manner that NOR calls $Mj0$ through $Mj+2m$ are provided at each of the intersection positions of word lines $WLj$, $WLj+1$, $Wj+2$, ..., and bit lines $BL0$, $BL1$, ..., $BLm$ respectively, the memory cell array is constituted in such a manner that the control gate of each of the NOR cell $Mj0$ through $Mj+2m$ is connected to word lines $WLj+1$, $WLj+2$, ... for each row and the drains are connected to the bit lines $BL0$, $BL1$, ..., $BLm$ for each column while the sources are commonly connected to the source line SL.

Figure 14:
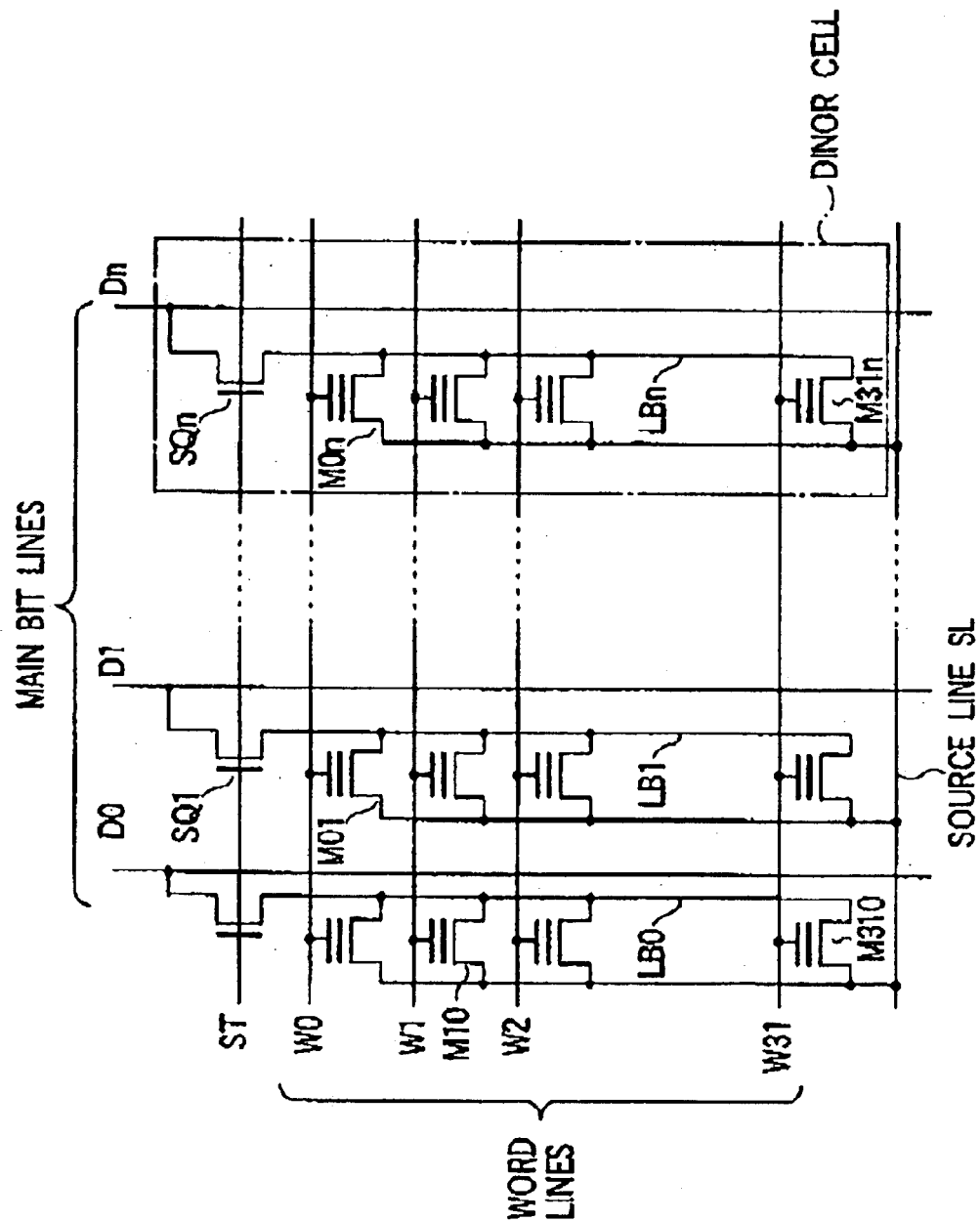
FIG. 14 is an equivalent circuit diagram showing a memory cell array in an DINOR cell type EEPROM, for explaining a semiconductor memory device according to a seventh embodiment of the present invention.

Furthermore, FIG. 14 is an equivalent circuit diagram showing a memory cell array in the DINOR cell type EEPROM. In the DINOR cell type memory cell array, the DINOR cells are provided corresponding to each of the bit lines $D0$, $D1$, ..., $Dn$. Each of the DINOR cells comprises select gate transistors $SQ0$, $SQ1$, ..., $SQn$ and memory cells $M00$ through $M31n$, and the drains of the above select transistors $SQ0$, $SQ1$, ..., $SQn$ are connected to each of the main bit lines $D0$, $D1$, ..., $Dn$ while the gate is connected to the select gate lines ST, and the sources are connected to the local bit lines $LB0$, $LB1$, ..., $Ln$ respectively. The drains of each of the memory cells $M00$ through $M31n$ are connected to the local bit lines $LB0$, $LD1$, ..., $LBn$ for each column. The control gate is connected to the word liner $W0$ through $W31$ for each row and the sources are connected to the source line SL.

Figure 15:
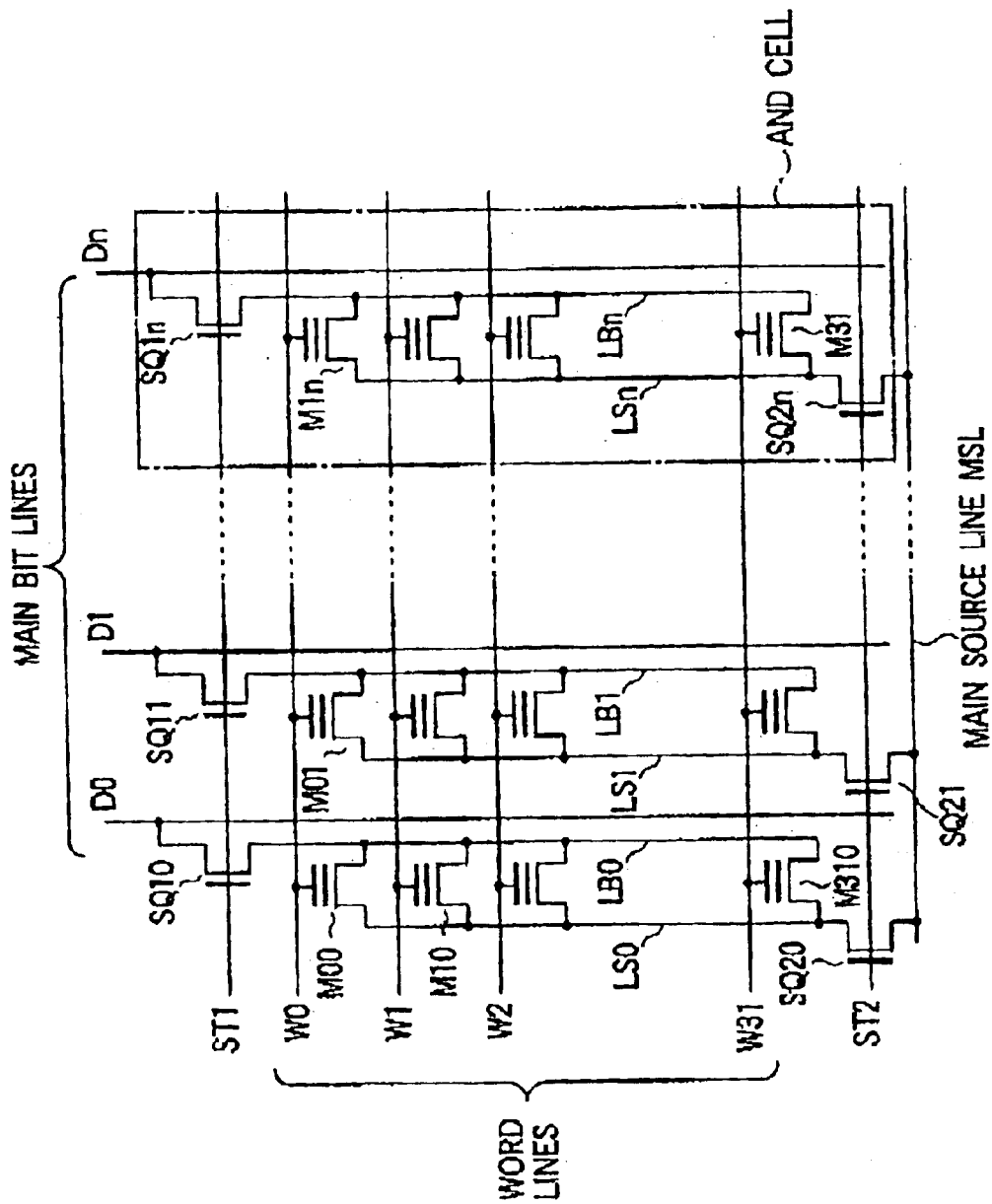
FIG. 15 is an equivalent circuit diagram showing a memory call array in an all type EEPROM, for explaining a conductor memory device according to an eighth embodiment of the present invention.

FIG. 15 is an equivalent circuit diagram showing a memory cell array in the AND cell type EEPROM. In the AND cell type EEPROM, the AND cells are provided in correspondence to each of the gain bit lines $D0$, $D1$, ..., $Dn$. Each of the AND cells comprises first select gate transistors $SQ10$, $SQ11$, ..., $SQ1n$, the memory cells $M00$ through $M31n$ and the second select gate transistors $SQ20$, $SQ21$, ..., $SQ2n$. The drains of the first select gate transistors $SQ10$, $S11$, ..., $SQ1n$ are connected to each of the main bit lines $D0$, $D1$, ..., $Dn$, and the gate is connected to the first select gate line ST1, and the sources are connected to the local bit lines $LB0$, $LB1$, ..., $LBn$ respectively. The drains of each of the memory cells $M00$ through $M31n$ are connected to the local bit lines $LB0$, $LB1$, ..., $LBn$ for each column. The control gate is connected to word lines $W0$ through $W311$ for each row. The sources are connected to the local source lines $LS0$, $LS1$, ..., $LS2n$. The drains of the second select gate transistors $SQ20$, $SQ21$, ..., $SQ2n$ are connected to each of the local source lines $LS0$, $LS1$, ..., $LSn$ respectively. The gate is connected to the second select gate line ST2 while the sources are commonly connected to the main source line ML respectively.

Figure 16:
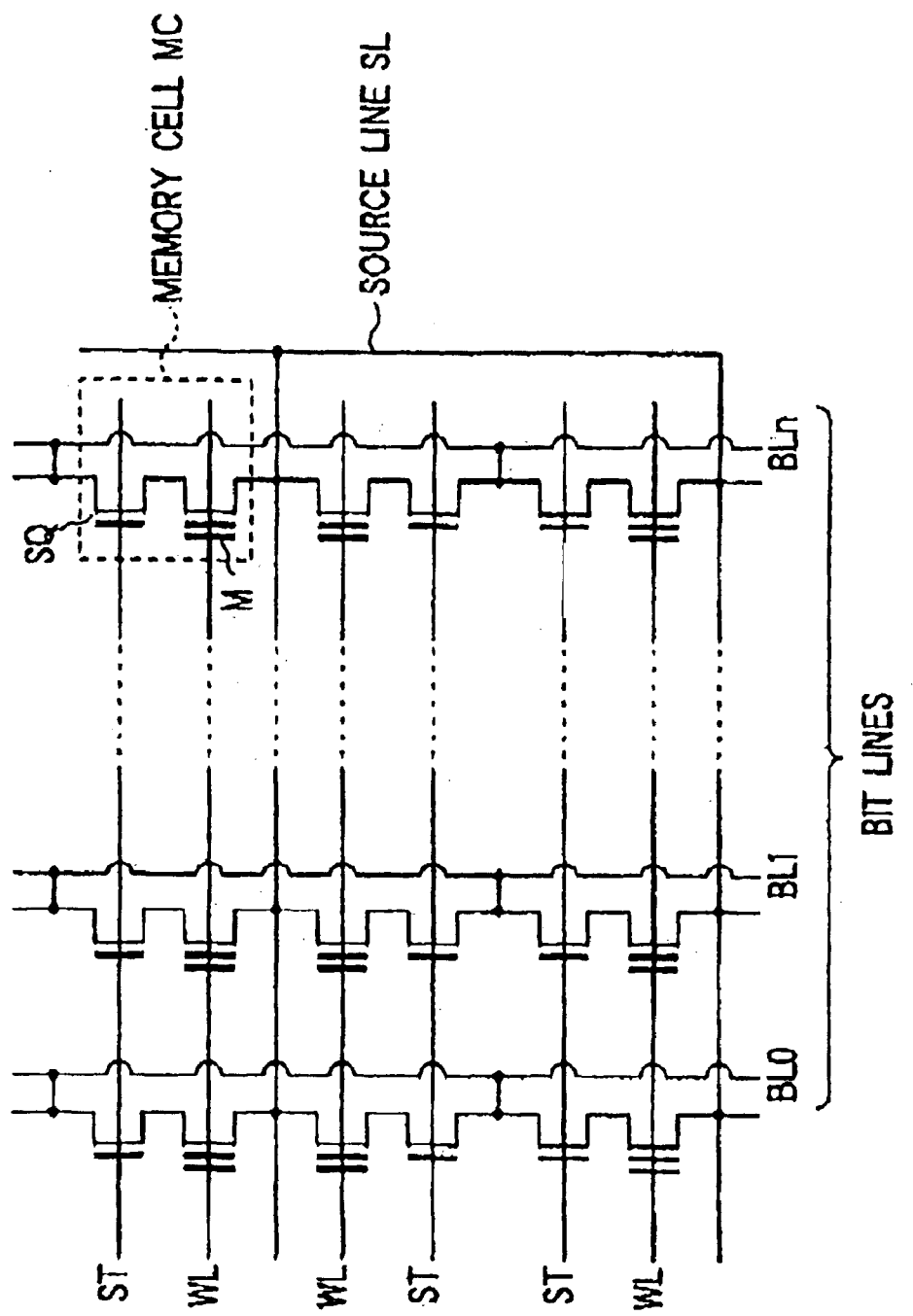
FIG. 16 in an equivalent circuit diagram showing a memory cell array in an NOR cell type EEPROM with a select transistor, for explaining a semiconductor memory device according to a ninth embodiment of the present invention.

Furthermore, FIG. 16 is an equivalent circuit showing a memory cell array in tho NOR call type EEPROM attached with a select transistor. This memory cell array is constituted in such a manner that memory cells comprising select transistors SQ and memory cell transistors M are arranged in matrix. The drains of each of the select transistors SQ are connected to the bit lines BL0, BL1, . . . , BLn, the gate is connected to the select gate lines ST for each row, and the source is connected to the drain of the corresponding memory cell transistor M. The control gate of the memory cell transistor M is connected to word lines WL for each row, and the sources are commonly connected to the source line SL.

Incidentally, with respect to tho details of the DINOR cell type EEPROM, see "H. Onda et al., IEDM Tech. Digest, 1992, pp. 599–602". With respect to the details of the AND cell type EEPROM, see "H. Kume et al., IEDM Tech Digest, 1992, pp. 991–993".

Furthermore, in the above embodiments, the present invention has been explained by taking an example of an electrically rewritable non-volatile semiconductor memory device. The present invention can be used with other devices. For example, the present invention can be applied to other non-volatile memory device, and devices such as DRAM's, SRAM's or the like.

As described above, the present invention has been explained by using the above embodiments. The present invention is not limited to the embodiments. Additional advantages and modification will readily occur to those skilled in the art. Therefore, the invention its broader aspects is not limited to the specific details and representative embodiments shown and described herein. Accordingly various modifications may be made without departing from the spirit or scope of the general inventive concept as defined by the appended claims and their equivalents.

As has been explained above, according to one aspect of the present invention, the leakage current to the channel portion in the NAND cell from the source line can be largely decreased by setting the source line potential at the time of data programming operation used in the reliability test to a lower level than at the time of the normal data programming operation. Consequently, an operation of simultaneously writing data to a large number of blocks can be used at the time of reliability test. As a consequence, a cheap and highly reliable chip can be realized as compared with the prior art.

Consequently, it is possible to obtain a semiconductor memory device which is capable of decreasing a total quantity of leakage current via the select gate transistor and the memory cell transistor connected to the source line.

Furthermore, it is possible to prevent problems such as an increase in the consumed current and an erroneous operation of chips at the time of quality control testing, and it is possible to obtain a semiconductor memory device which requires less time when quality control tested.

Furthermore, it is possible to obtain a semiconductor memory device which is capable of realizing a cheap and highly reliable chip.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A semiconductor memory device comprising:
   a memory cell having a gate, a source and a drain;
   at least one select gate transistor provided between a source line and the source of the memory cell;
   a circuit configured to rewrite data in the memory cell by applying a higher potential to the gate than a potential of the source or the drain, a first potential difference between the gate and the source or between the gate and the drain being larger than a power supply voltage, the circuit operating a first data programming mode and a second data programming mode;
   a first command or a first command combination which is used for the first data programming mode; and
   a second command or a second command combination which is used for the second data programming mode;
   wherein the first command or the first command combination is different from the second command or the second command combination, and the source line is set to different potentials between the first data programming mode and the second data programming mode, in a period when data is rewritten.

2. The semiconductor memory device according to claim 1, wherein the source line is set to the different potentials in a first period when the first potential difference is larger than a power supply voltage in the memory cell with a first writing data.

3. The semiconductor memory device according to claim 2, wherein only one control gate line is selected in each selected memory cell array in the first data programming mode, and two or more control gate lines in each memory cell array are selected simultaneously in the second data programming mode.

4. The semiconductor memory device according to claim 2, wherein only one control gate line is selected in each selected block in the first data programming mode, and two or more control gate lines in each selected block are selected simultaneously in the second data programming mode.

5. The semiconductor memory device according to claim 4, wherein all control gate lines in each selected block are selected simultaneously in the second data programming mode.

6. The semiconductor memory device according to claim 2, wherein only one block is selected in each selected memory cell array in the first data programming mode, and two or more blocks in each selected memory cell array are selected simultaneously in the second data programming mode.

7. The semiconductor memory device according to claim 3, wherein all electrically programmable and erasable memory cells connected to all control gate lines in each selected memory cell array are selected simultaneously in the second data programming mode.

8. The semiconductor memory device according to claim 3, wherein all electrically programmable and erasable memory cells connected to all control gate lines in each selected memory cell array, except for control gate lines in one or more failure blocks, are selected simultaneously in the second data programming mode.

9. The semiconductor memory device according to claim 3, wherein all electrically programmable and erasable memory cells connected to all control gate lines in one chip are selected simultaneously in the second data programming mode.

10. The semiconductor memory device according to claim 3, wherein all electrically programmable and erasable memory cells connected to all control gate lines in one chip, except for control gate lines in one or more failure blocks, are selected simultaneously in the second data programming mode.

11. The semiconductor memory device according to claim 2, wherein writing data are input from outside of a chip in the first data programming mode.

12. The semiconductor memory device according to claim 11, wherein in the second data programming mode, writing data are made inside of a chip and are the same data for all selected memory cells.

13. The semiconductor memory device according to claim 12, wherein in the second data programming mode, the writing data are the same as the first writing data.

14. The semiconductor memory device according to claim 2, wherein the first writing data corresponds to data of a memory cell with positive threshold voltage.

15. The semiconductor memory device according to claim 2, wherein a source line potential in the first period is equal to a bit line potential set for the first writing data in the second data programming mode.

16. The semiconductor memory device according to claim 2, wherein the source line potential in the first period is 0V in the second data programming mode.

17. The semiconductor memory device according to claim 2, further comprising a programming high voltage generating circuit configured to generate a programming high voltage in the first data programming mode, and a programming intermediate voltage generating circuit configured to generate a programming intermediate voltage in the first data programming mode.

18. A semiconductor memory device comprising:
a memory cell having a gate, a source and a drain;
at least one select gate transistor provided between a source line and the source of the memory cell;
a circuit configured to rewrite data in the memory cell by applying a higher potential to the gate than a potential of the source or the drain, a first potential difference between the gate and the source or between the gate and the drain being larger than a power supply voltage, the circuit operating a first data programming mode and a second data programming mode; and
a first command or a first command combination which can change a potential of the source line in a period when data is rewritten,
wherein the source line is set to different potentials between the first data programming mode and the second data programming mode, in a period when data is rewritten by using the first command or the first command combination in the second data programming mode.

19. The semiconductor memory device according to claim 18, wherein the source line is set to the different potentials in a first period when the first potential difference is larger than a power supply voltage in the memory cell with a first writing data.

20. The semiconductor memory device according to claim 19, wherein the first command or the first command combination is not used in the first data programming mode.

21. The semiconductor memory device according to claim 19, wherein source line potential data which control the source line potential in a period when data is rewritten is also input for a data programming mode for which the first command or the first command combination is input.

22. The semiconductor memory device according to claim 19, wherein only one control gate line is selected in each selected memory cell array in the first data program mode, and two or more control gate lines in each memory cell array are selected simultaneously in the second data programming mode.

23. The semiconductor memory device according to claim 19, wherein only one control gate line is selected in each selected block in the first data programming mode, and two or more control gate lines in each selected block are selected simultaneously in the second data programming mode.

24. The semiconductor memory device according to claim 23, wherein all control gate lines in each selected block are sejected simultaneously in the second data programming mode.

25. The semiconductor memory device according to claim 19, wherein only one block is selected in each selected memory cell array in the first data programming mode, and two or more blocks in each selected memory cell array are selected simultaneously in the second data programming mode.

26. The semiconductor memory device according to claim 22, wherein all electrically programmable and erasable memory cells connected to all control gate lines in each selected memory cell array are selected simultaneously in the second data programming mode.

27. The semiconductor memory device according to claim 22, wherein all electrically programmable and erasable memory cells connected to all control gate lines in each selected memory cell array, except for control gate lines in one or more failure blocks, are selected simultaneously in the second data programming mode.

28. The semiconductor memory device according to claim 22, wherein all electrically programmable and erasable memory cells connected to all control gate lines in one chip are selected simultaneously in the second data programming mode.

29. The semiconductor memory device according to claim 22, wherein all electrically programmable and erasable memory cells connected to all control gate lines in one chip, except for control gate lines in one or more failure blocks, are selected simultaneously in the second data programming mode.

30. The semiconductor memory device according to claim 19, wherein writing data are input from outside of a chip in the first data programming mode.

31. The semiconductor memory device according to claim 30, wherein in the second data programming mode, writing data are made inside of a chip and are the same data for all selected memory cells.

32. The semiconductor memory device according to claim 31, wherein in the second data programming mode, the writing data are the same as the first writing data.

33. The semiconductor memory device according to claim 19, wherein the first wiring data corresponds to data of a memory cell with positive threshold voltage.

34. The semiconductor memory device according to claim 19, wherein a source line potential in the first period is equal to the bit line potential set for the first writing data in the second data programming mode.

35. The semiconductor memory device according to claim 19, wherein the source line potential in the first period is 0V in the second data programming mode.

36. The semiconductor memory device according to claim 19, further comprising a programming high voltage generating circuit configured to generate a programming high voltage in the first data programming mode, and a programming intermediate voltage generating circuit configured to generate a programming intermediate voltage in the first data programming mode.

37. A semiconductor memory device comprising:
a memory cell having a gate, a source and a drain;
at least one select gate transistor provided between a source line and the source of the memory cell; and
a circuit configured to rewrite data in the memory cell by applying a higher potential to the gate than a potential of the source or the drain, a first potential difference between the gate and the source or between the gate and the drain being larger than a power supply voltage, the circuit operating a first data programming mode and a second data programming mode, wherein a source line potential in a period when data is rewritten is dependent on writing data to selected memory cells.

38. The semiconductor memory device according to claim 37, wherein the source line is set to the different potentials in a first period when the first potential difference is larger than a power supply voltage in the memory cell with a first writing data.

39. The semiconductor memory device according to claim 38, wherein second writing data make a potential of corresponding bit lines the lowest level in all writing data in a period when data is rewritten, and the source line potential when writing data are the same as the first writing data is different from the source line potential when writing data are different from the second writing data.

40. The semiconductor memory device according to claim 39, wherein second writing data are writing data which make memory cell threshold voltages positive levels.

41. The semiconductor memory device according to claim 40, wherein the second writing data are writing data which make memory cell threshold voltages the highiest level in all writing data.

42. The semiconductor memory device according to claim 38, wherein only one control gate line is selected in each selected memory cell array in the first data programming mode, and two or more control gate lines in each memory cell array are selected simultaneously in the second data programming mode.

43. The semiconductor memory device according to claim 38, wherein only one control gate line is selected in each selected block in the first data programming mode, and two or more control gate lines in each selected block are selected simultaneously in the second data programming mode.

44. The semiconductor memory device according to claim 43, wherein all control gate lines in each selected block are selected simultaneously in the second data programming mode.

45. The semiconductor memory device according to claim 38, wherein only one block is selected in each selected memory cell array in the first data programming mode, and two or more blocks in each selected memory cell array are selected simultaneously in the second data programming mode.

46. The semiconductor memory device according to claim 42, wherein all electrically programmable and erasable memory cells connected to all control gate lines in each selected memory cell array are selected simultaneously in the second data programming mode.

47. The semiconductor memory device according to claim 42, wherein all electrically programmable and erasable memory cells connected to all control gate lines in each selected memory cell array, except for control gate lines in one or more failure blocks, are selected simultaneously in the second data programming mode.

48. The semiconductor memory device according to claim 42, wherein all electrically programmable and erasable memory cells connected to all control gate lines in one chip are selected simultaneously in the second data programming mode.

49. The semiconductor memory device according to claim 42, wherein all electrically programmable and erasable memory cells connected to all control gate lines in one chip, except for control gate lines in one or more failure blocks, are selected simultaneously in the second data programming mode.

50. The semiconductor memory device according to claim 38, wherein writing data are input from outside of a chip in the first data programming mode.

51. The semiconductor memory device according to claim 50, wherein in the second data programming mode, writing data are made inside of a chip and are the same data for all selected memory cells.

52. The semiconductor memory device according to claim 51, wherein in the second data programming mode, the writing data are the same as the first writing data.

53. The semiconductor memory device according to claim 38, wherein the first writing data corresponds to data of a memory cell with positive threshold voltage.

54. The semiconductor memory device according to claim 38, wherein the source line potential in the first period is equal to a bit line potential set for the first writing data in the second data programming mode.

55. The semiconductor memory device according to claim 38, wherein the source line potential in the first period is 0V in the second data programming mode.

56. The semiconductor memory device according to claim 38, further comprising a programming high voltage generating circuit configured to generate a programming high voltage in the first data programming mode, and a programming intermediate voltage generating circuit configured to generate a programming intermediate voltage in the first data programming mode.

57. The semiconductor memory device according to claim 2, wherein the semiconductor memory device is a flash memory.

58. The semiconductor memory device according to claim 57, wherein the semiconductor memory device is a NAND-type flash memory.

59. The semiconductor memory device according to claim 19, wherein the semiconductor memory device is a flash memory.

60. The semiconductor memory device according to claim 59, wherein the semiconductor memory device is a NAND-type flash memory.

61. The semiconductor memory device according to claim 38, wherein the semiconductor memory device is a flash memory.

62. The semiconductor memory device according to claim 61, wherein the semiconductor memory device is a NAND-type flash memory.

* * * * *